United States Patent
Kondo et al.

(10) Patent No.: US 8,830,718 B2
(45) Date of Patent: Sep. 9, 2014

(54) MAGNETIC MEMORY

(71) Applicant: Kabushiki Kaisha Toshiba, Minato-ku (JP)

(72) Inventors: Tsuyoshi Kondo, Kawasaki (JP); Hirofumi Morise, Yokohama (JP); Shiho Nakamura, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/953,232

(22) Filed: Jul. 29, 2013

(65) Prior Publication Data

US 2014/0085970 A1 Mar. 27, 2014

(30) Foreign Application Priority Data

Sep. 24, 2012 (JP) ................. 2012-209152

(51) Int. Cl.
 *G11C 19/02* (2006.01)
 *G11C 11/02* (2006.01)
 *G11C 11/16* (2006.01)

(52) U.S. Cl.
 CPC .................. *G11C 11/161* (2013.01)
 USPC ............. 365/85; 365/80; 365/81; 365/158

(58) Field of Classification Search
 USPC ........................................................ 365/85
 See application file for complete search history.

(56) References Cited

U.S. PATENT DOCUMENTS

| 8,625,335 B2* | 1/2014 | Morise et al. ................. 365/158 |
| 8,634,237 B2* | 1/2014 | Kondo et al. ................. 365/158 |
| 2010/0061135 A1* | 3/2010 | Nagasaka et al. ............... 365/80 |
| 2013/0077395 A1 | 3/2013 | Kondo et al. |

FOREIGN PATENT DOCUMENTS

JP 2008-160079 7/2008

* cited by examiner

*Primary Examiner* — Son Mai
(74) *Attorney, Agent, or Firm* — Oblon, Spivak, McClelland, Maier & Neustadt, L.L.P.

(57) ABSTRACT

A magnetic memory includes a magnetic wire, a first insulating layer, first electrodes a second electrode, a current supplying module, and a voltage applying module. The magnetic wire includes a first portion and a second portion, has a first electric resistance value, and is configured to form magnetic domains. The first electrodes are formed on the first insulating layer, arranged along the magnetic wire, and spaced from each other. The second electrode includes a third portion and a fourth portion. The second electrode is electrically connected to the first electrodes between the third portion and the fourth portion and has a second electric resistance value being larger than the first electric resistance value. The current supplying module is configured to supply the magnetic wire with a pulse current. The voltage applying module is configured to apply a voltage that decreases with time.

10 Claims, 32 Drawing Sheets

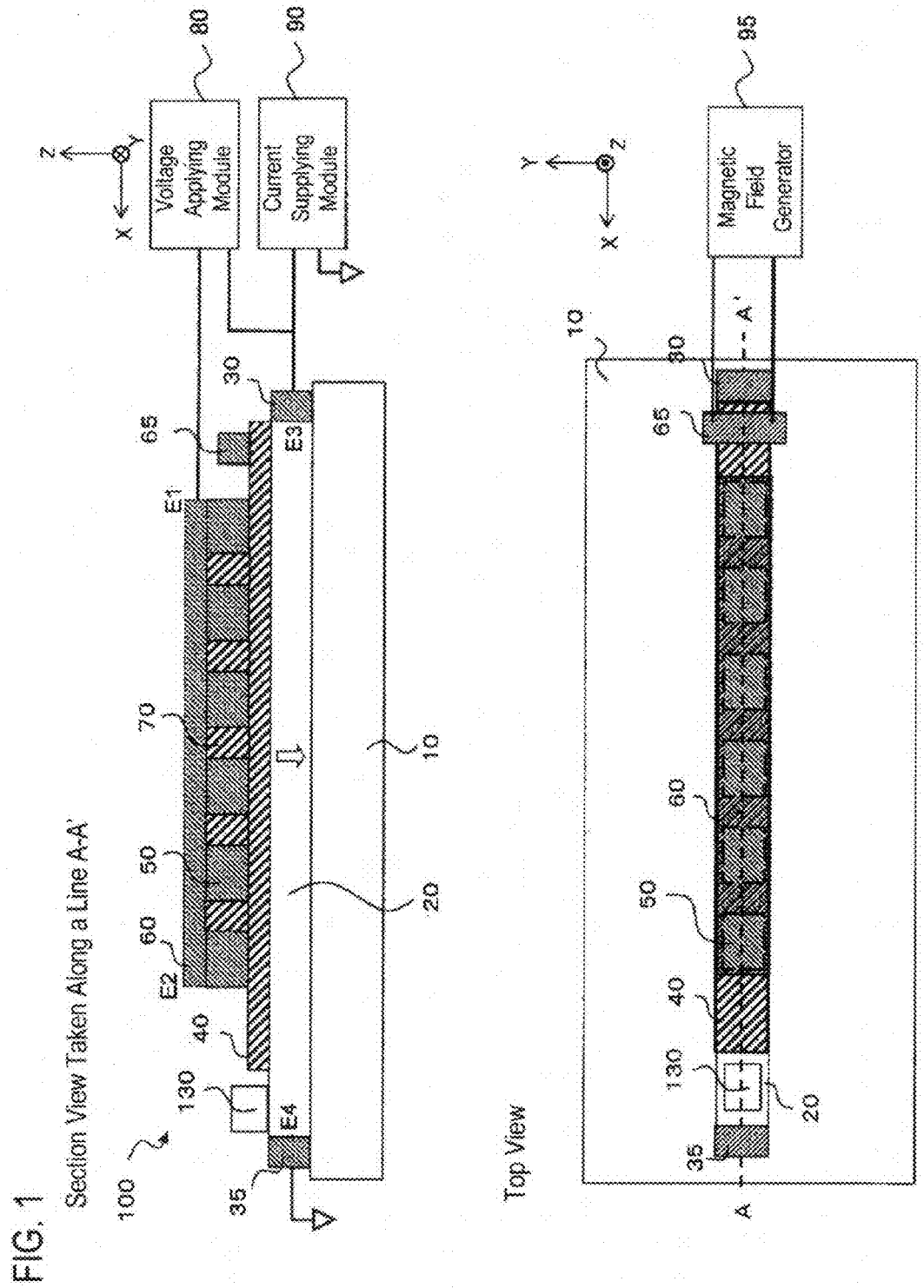

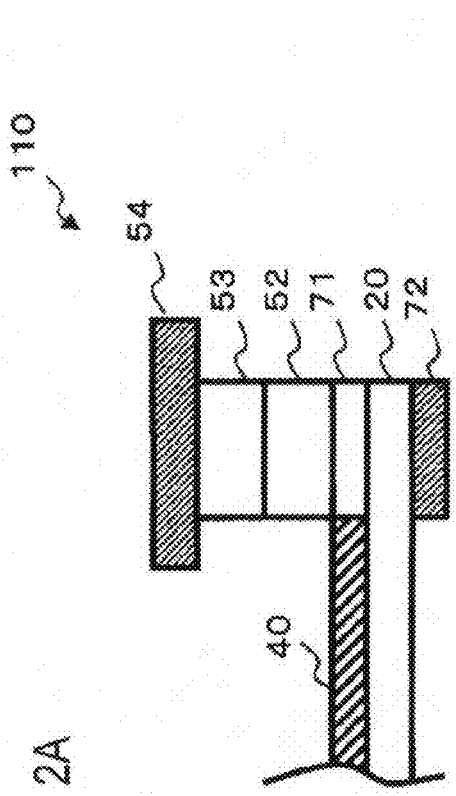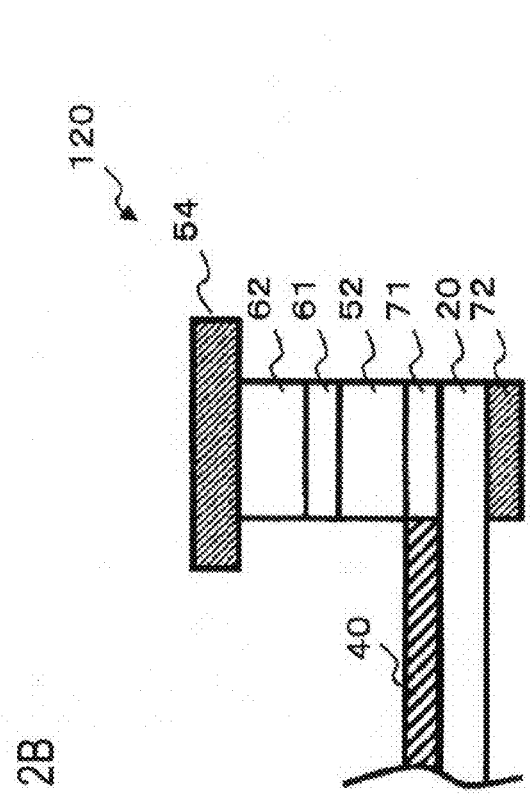

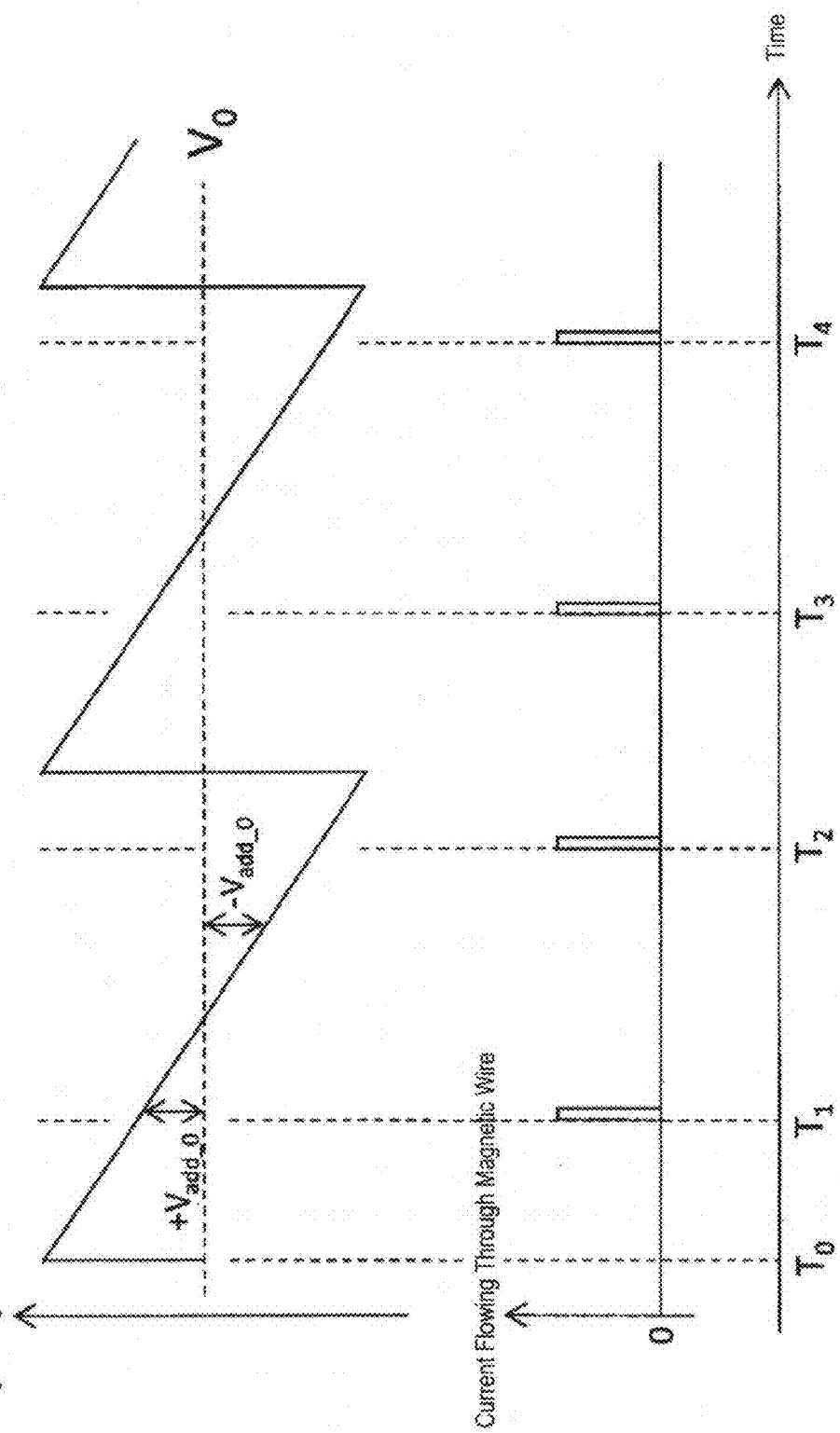

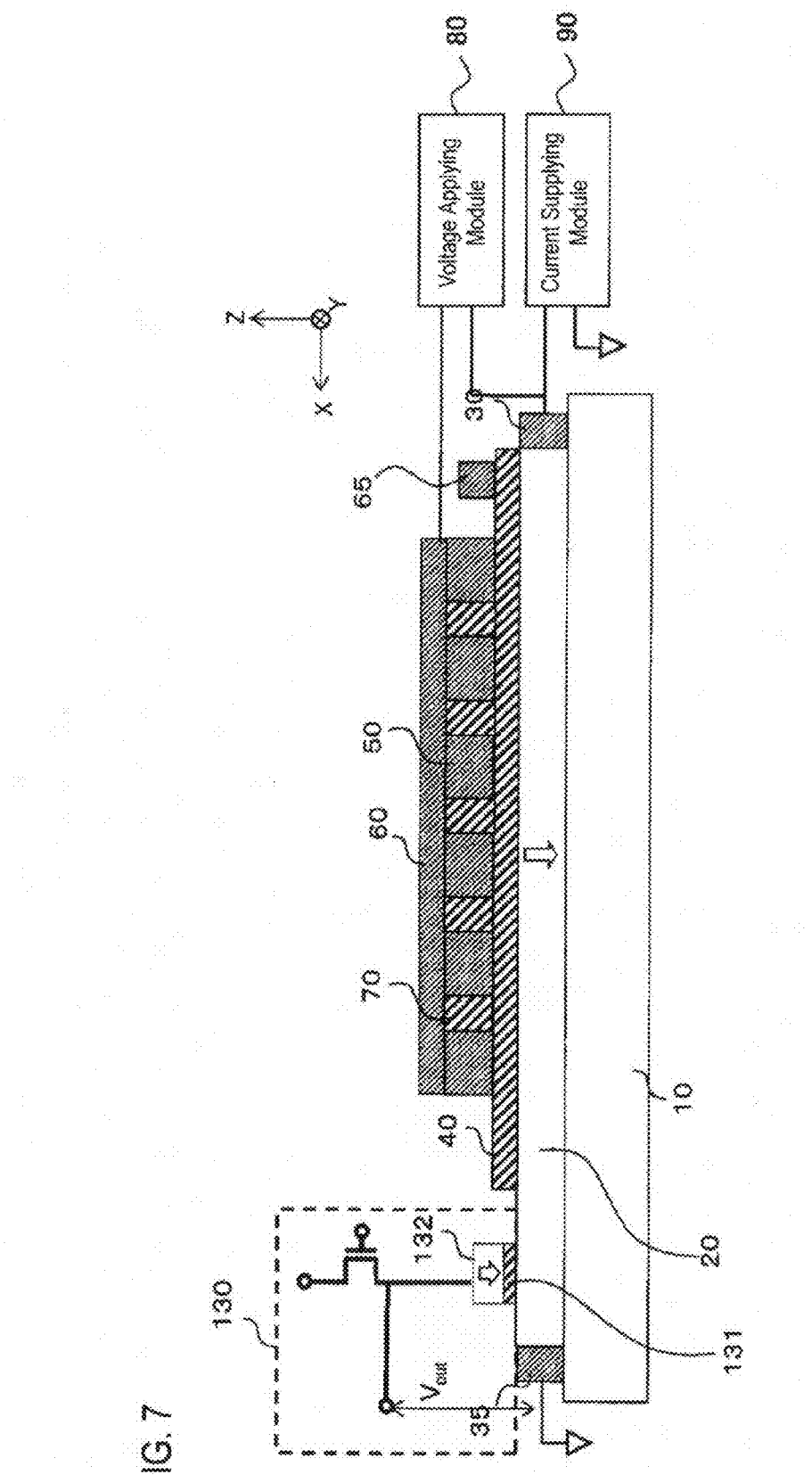

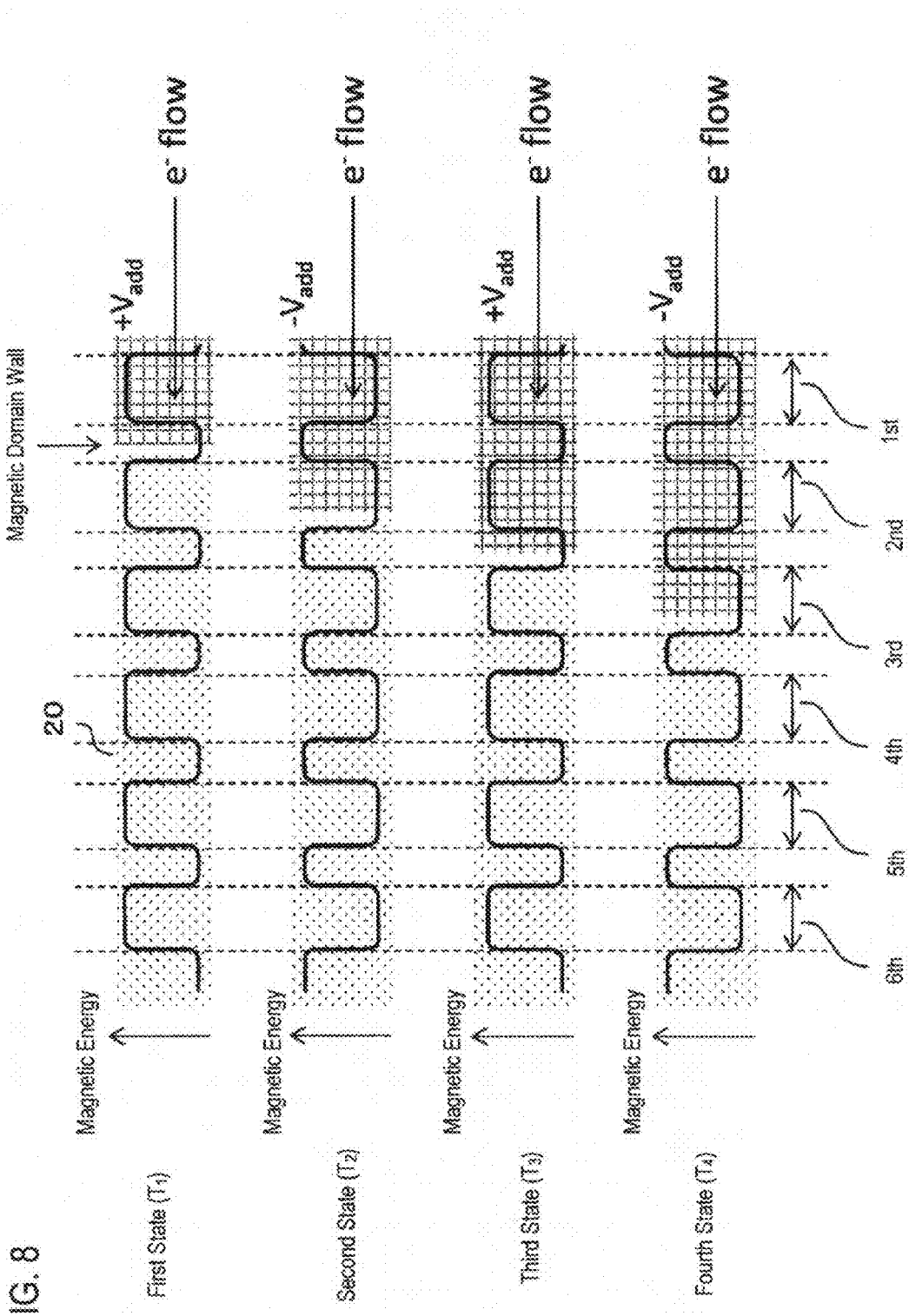

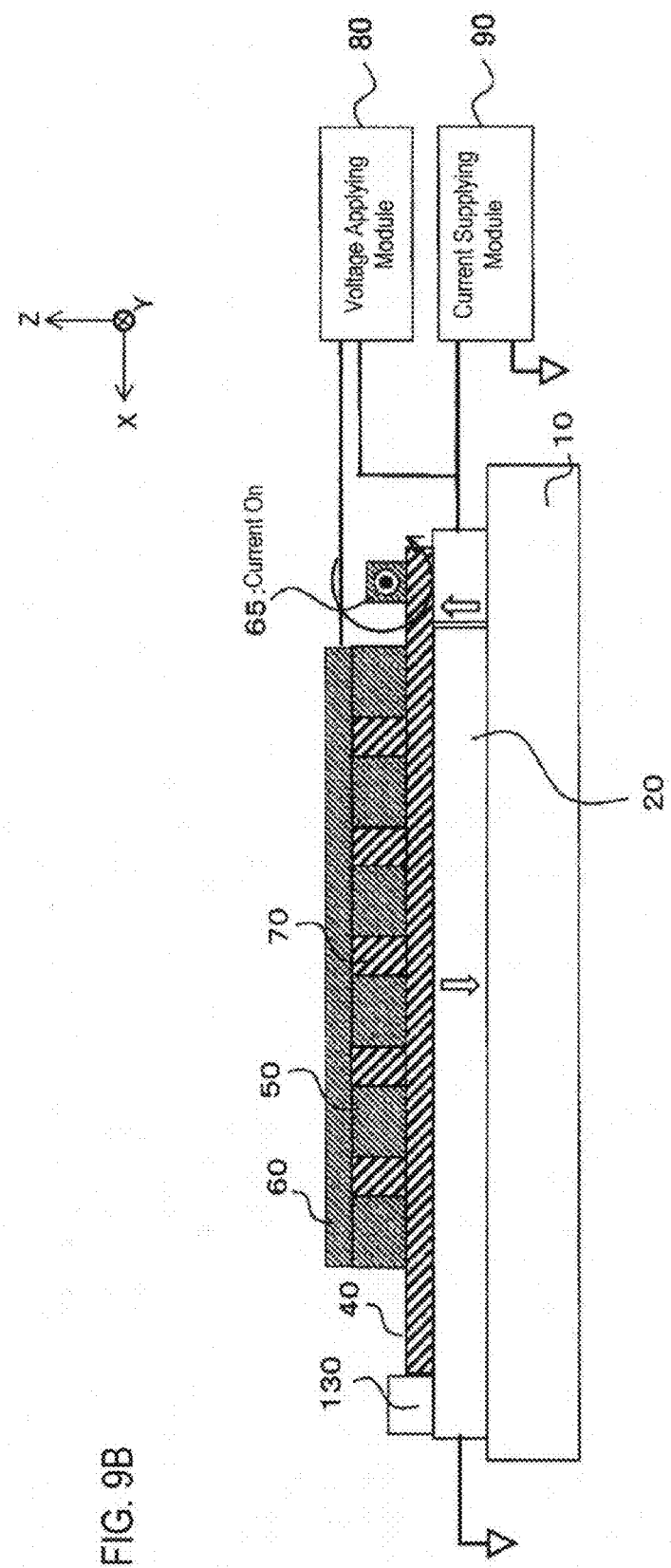

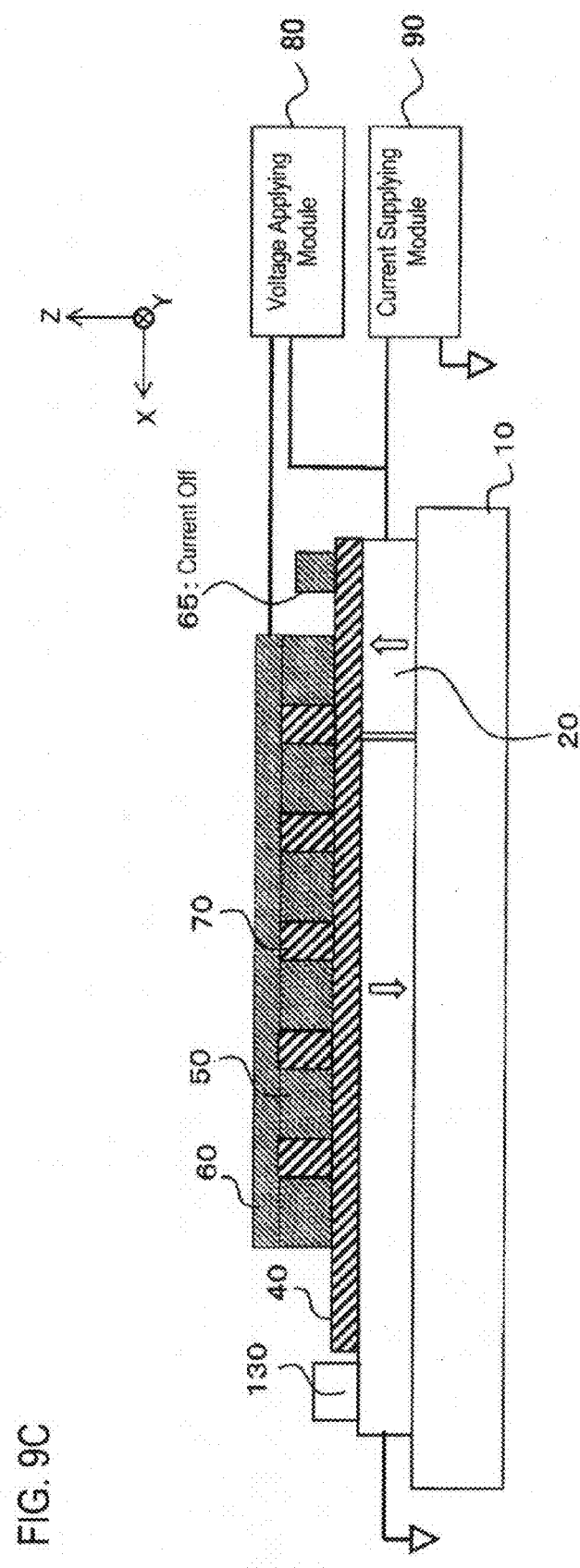

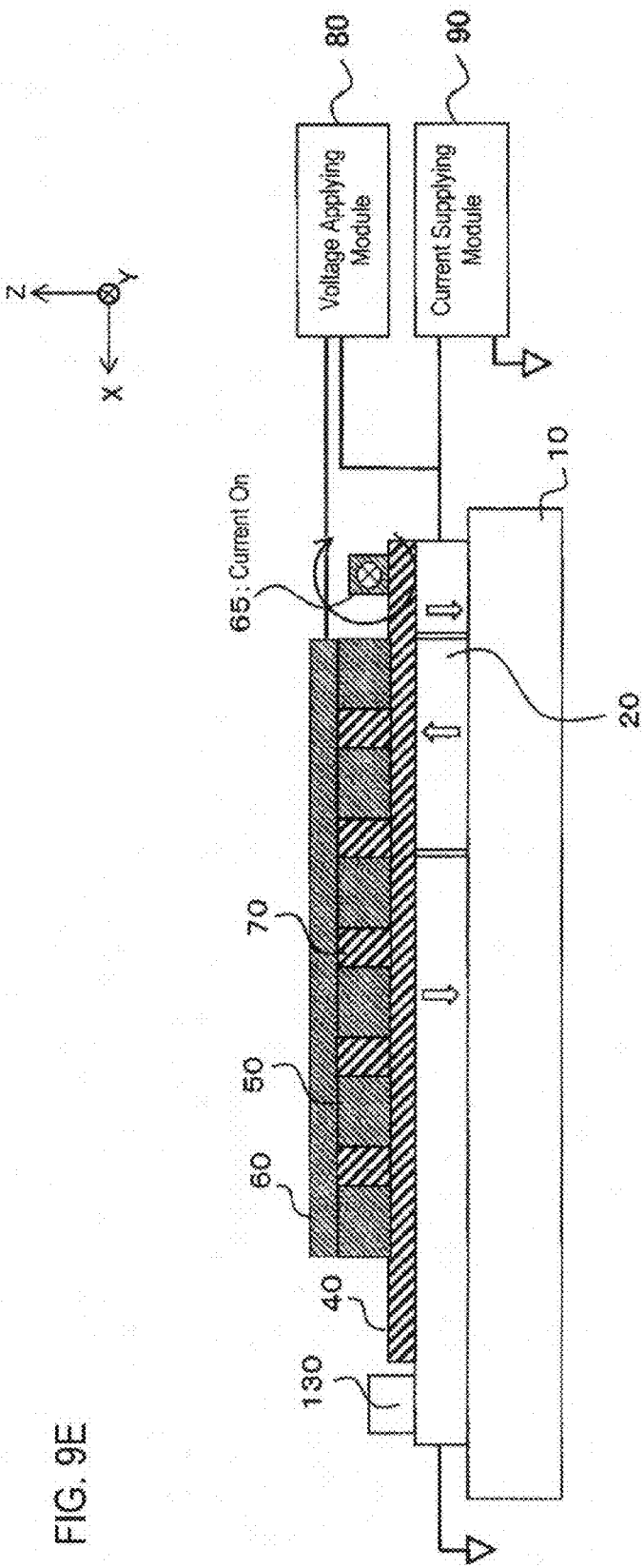

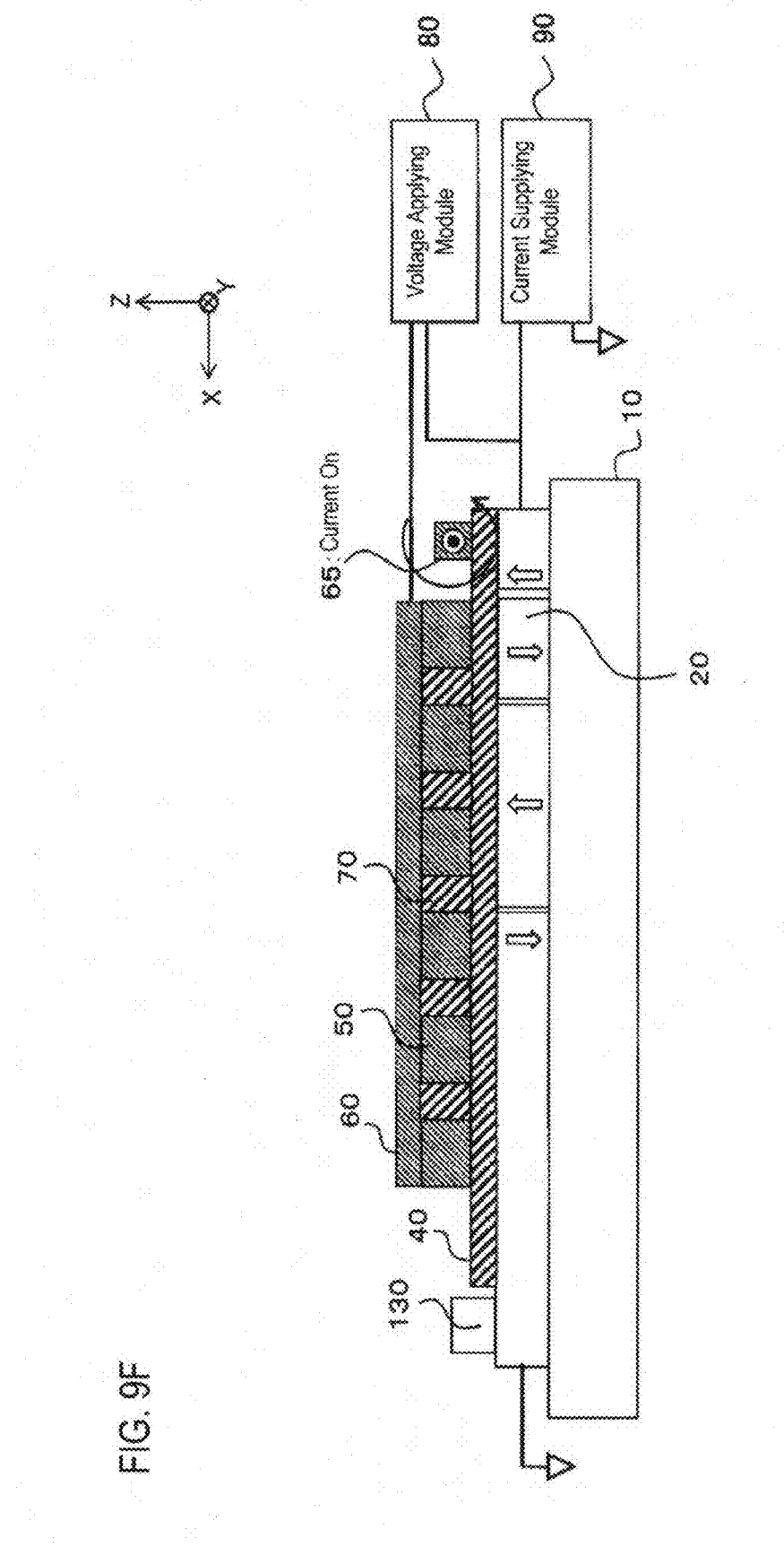

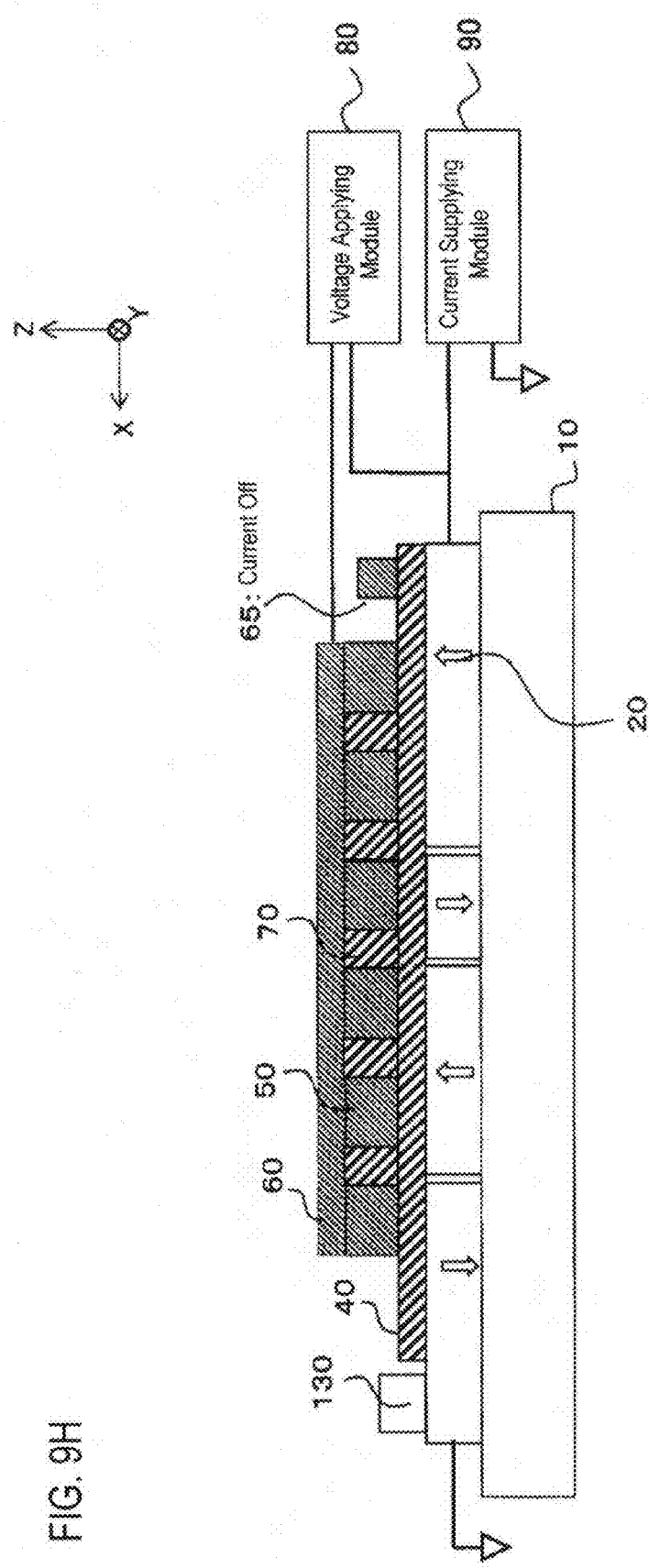

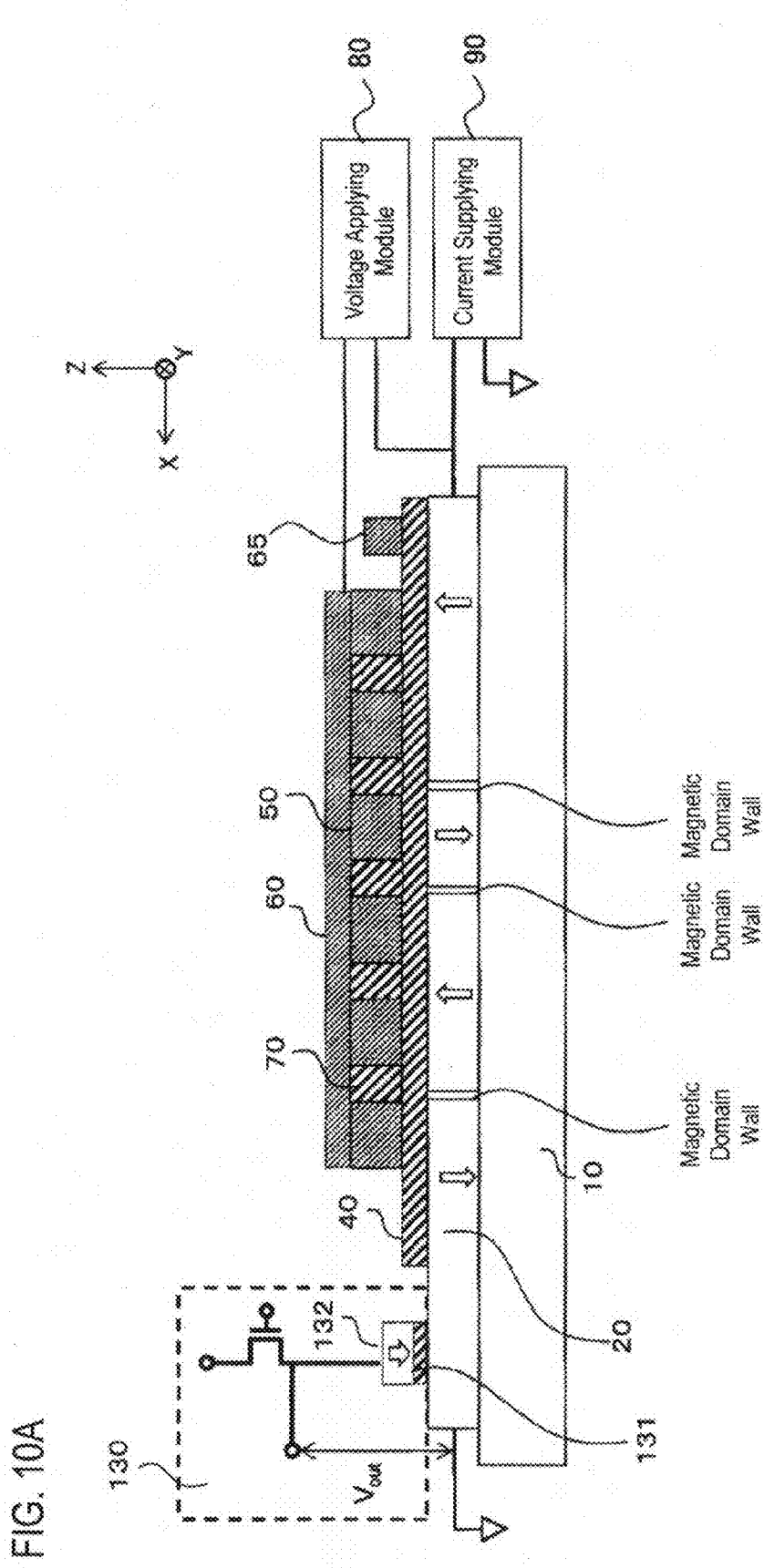

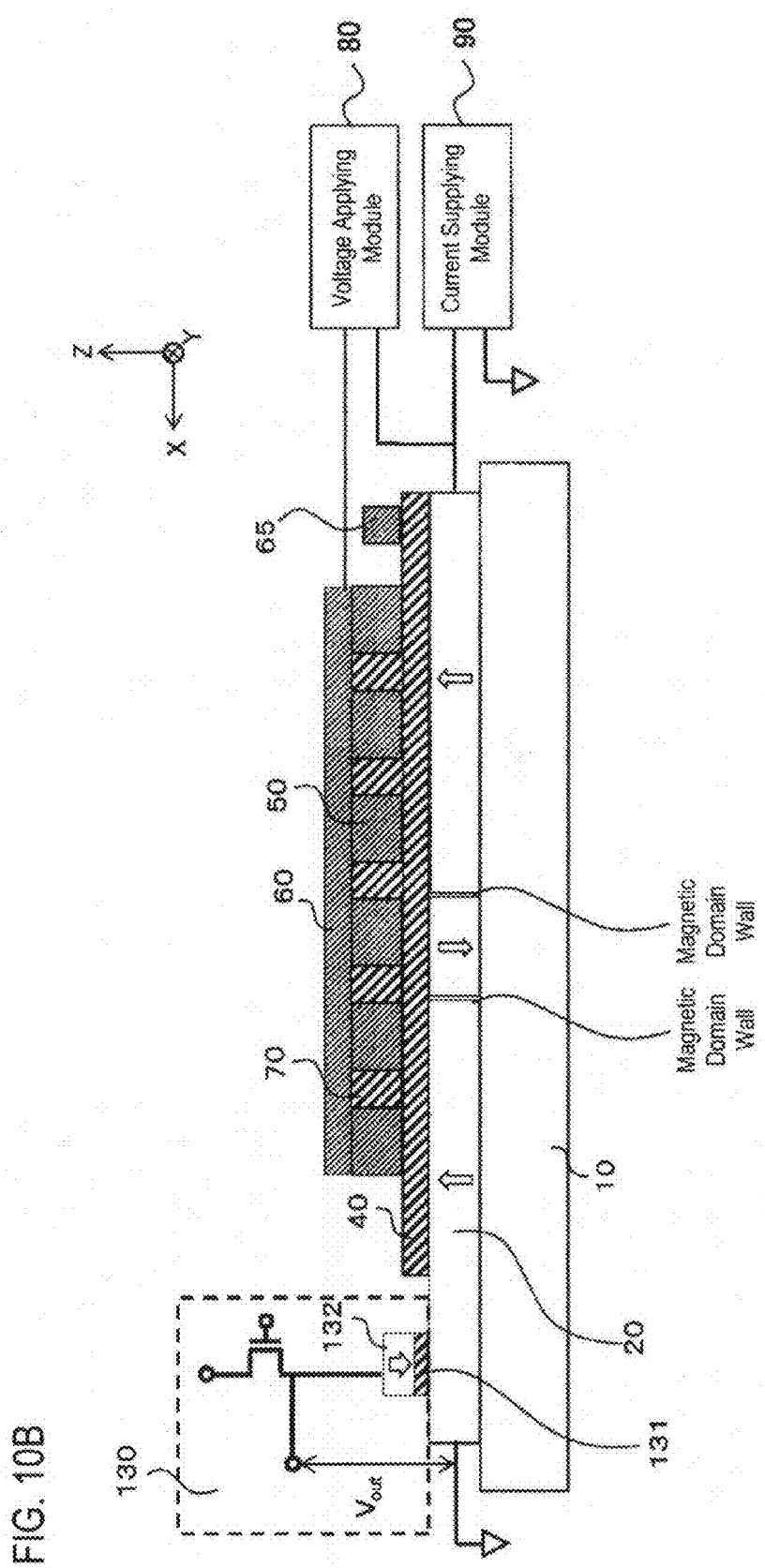

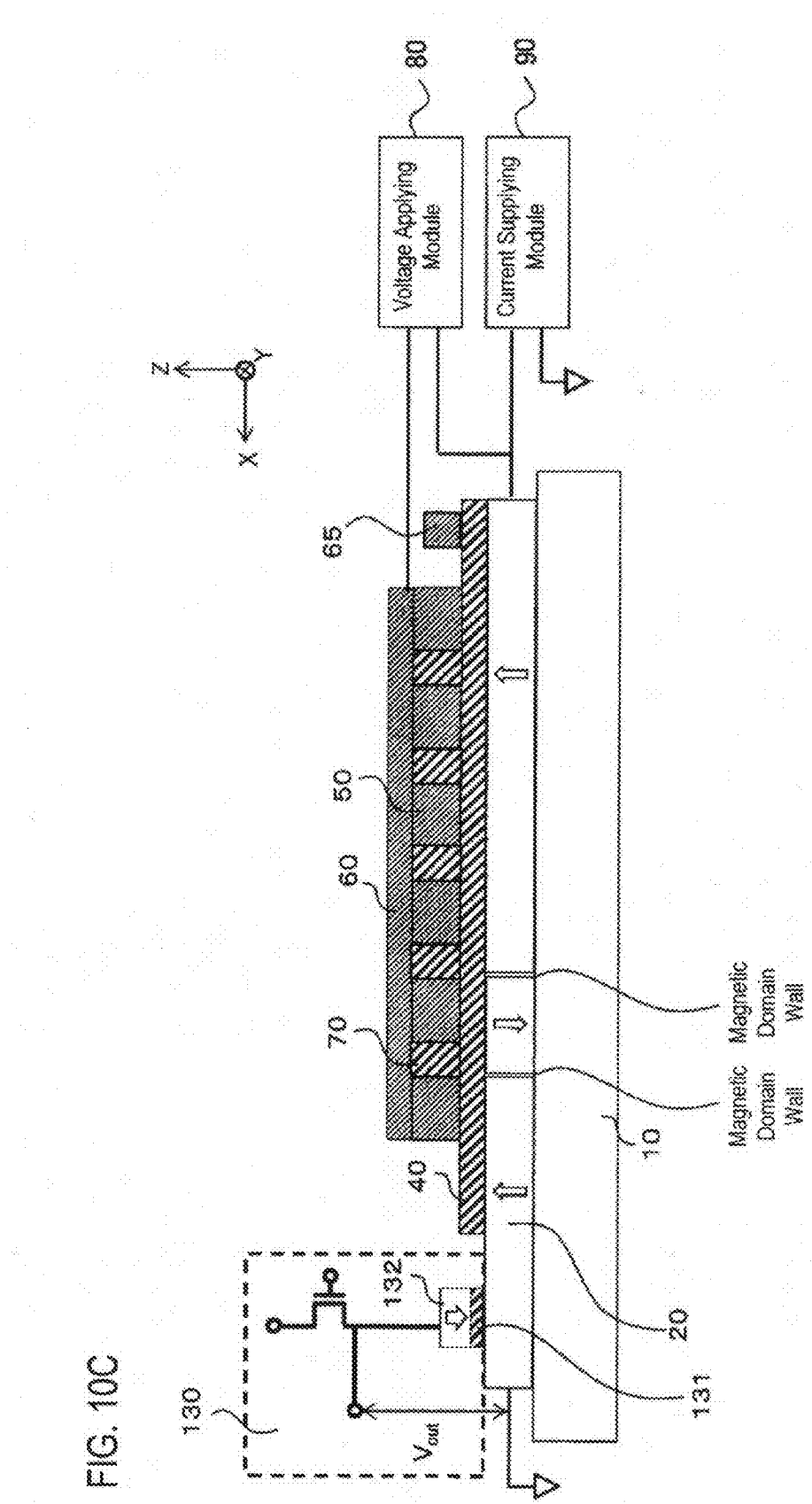

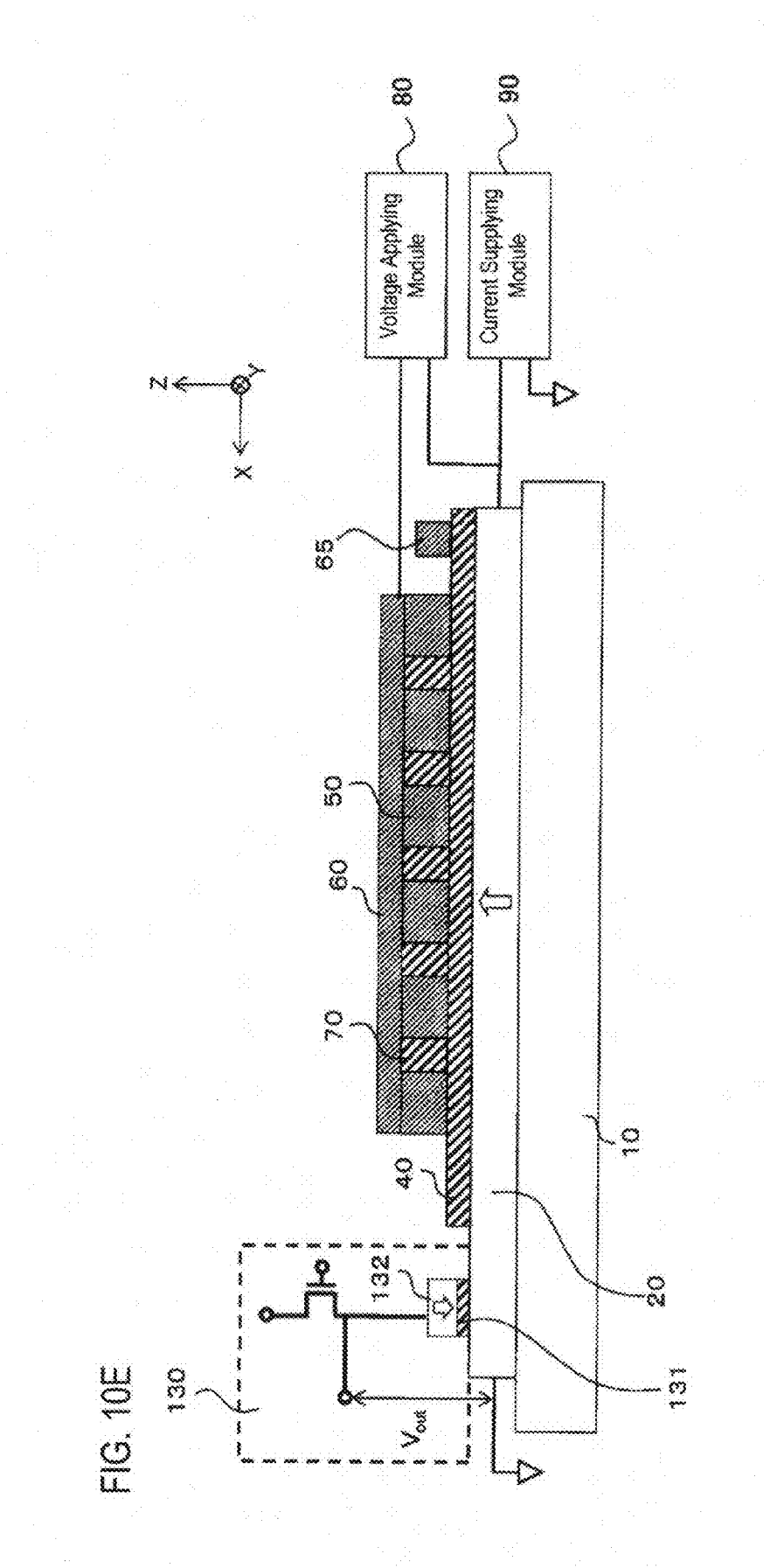

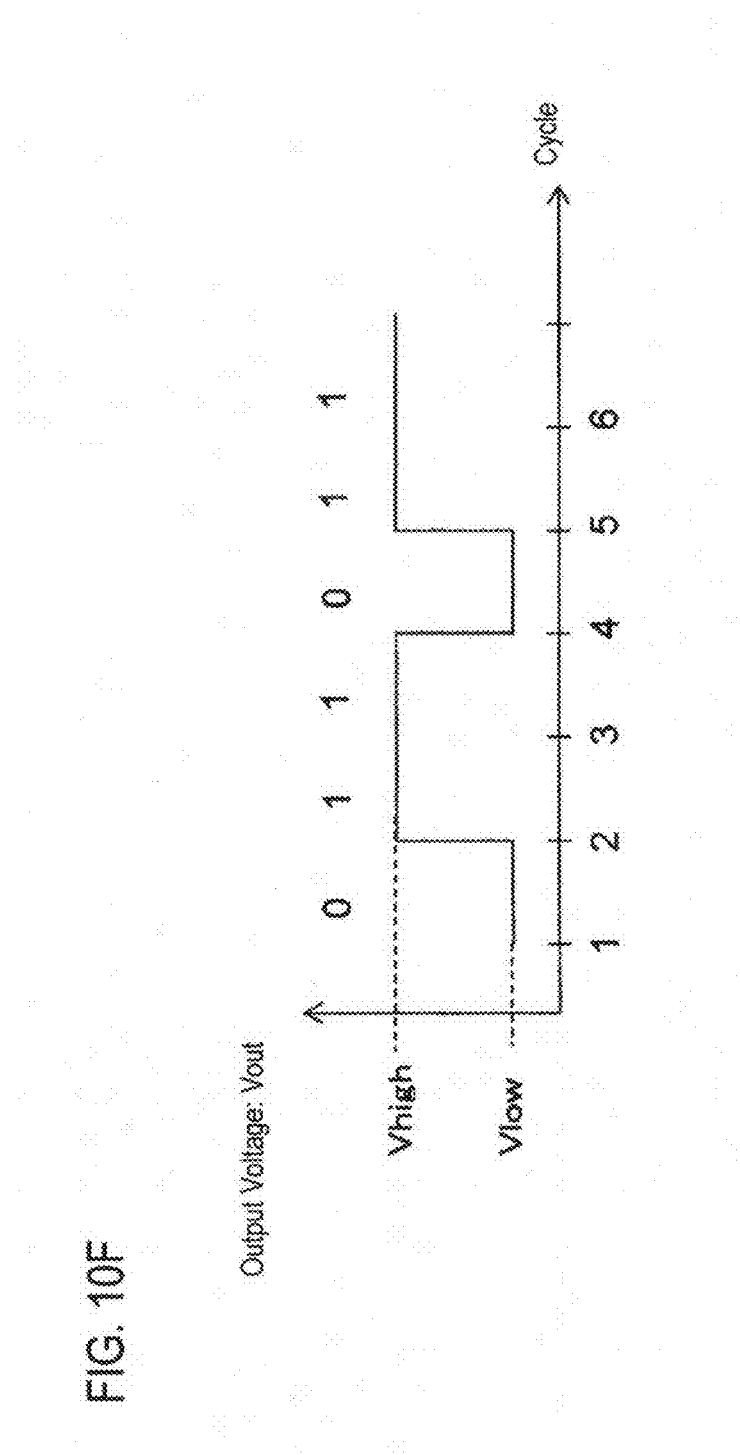

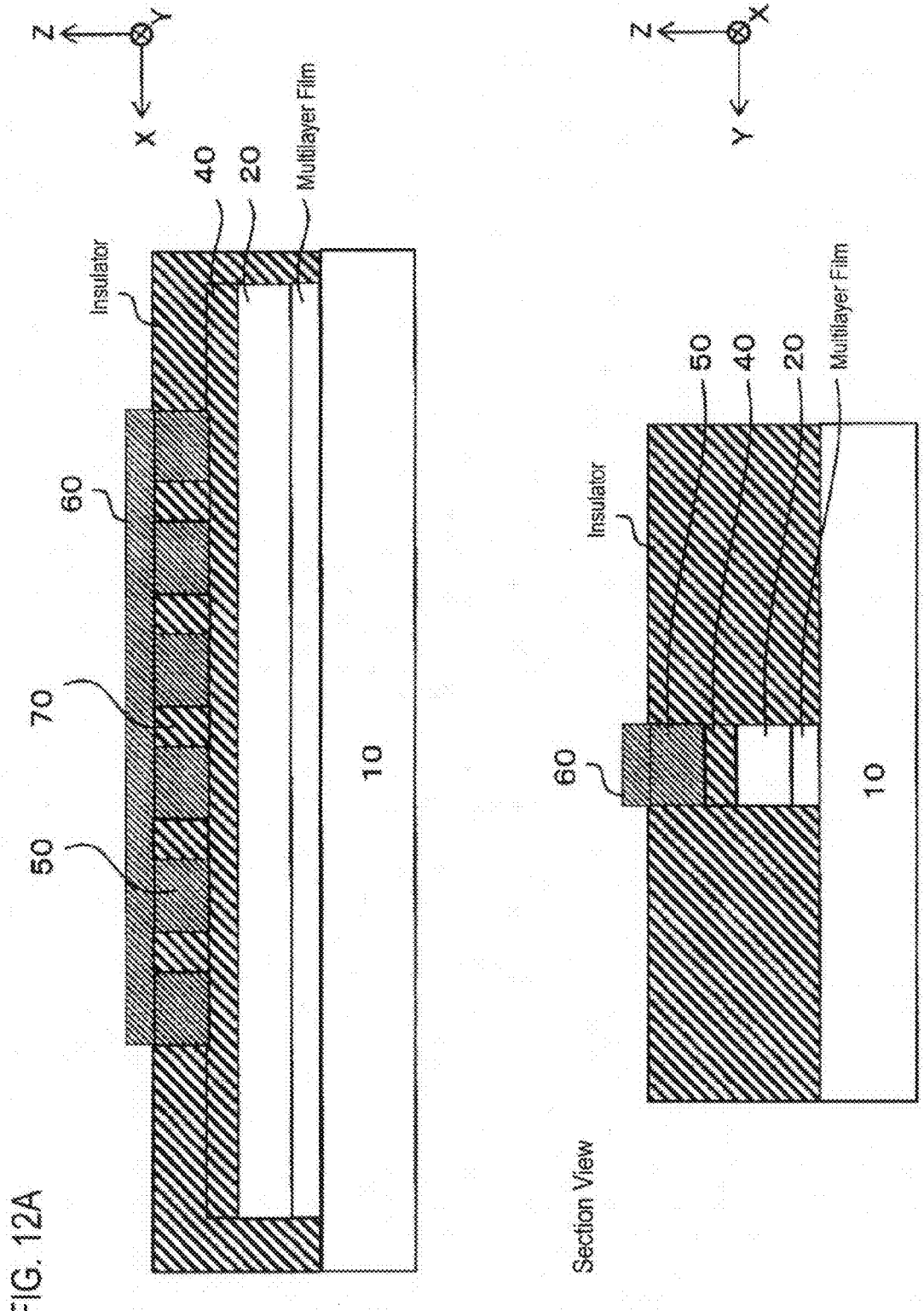

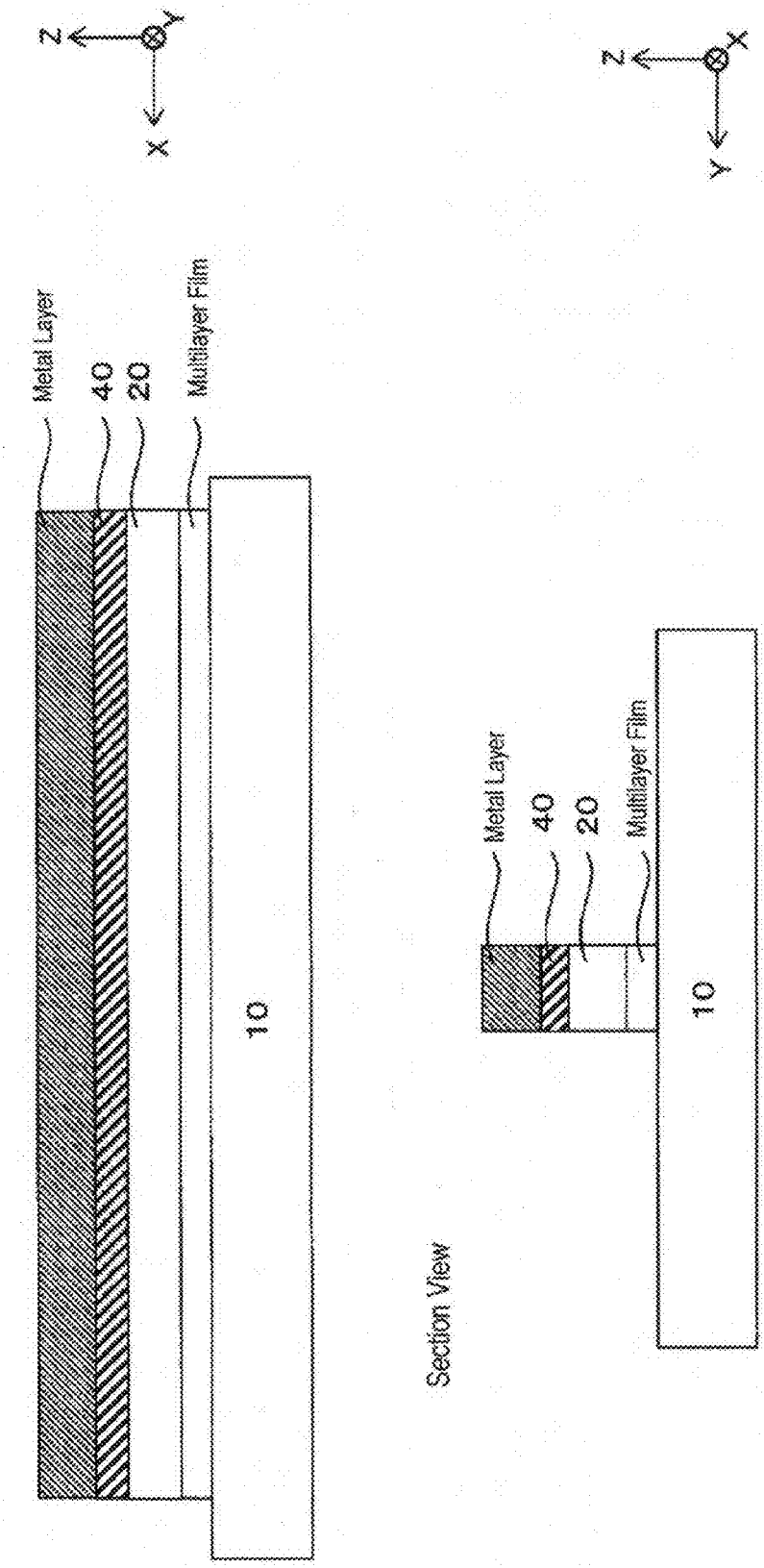

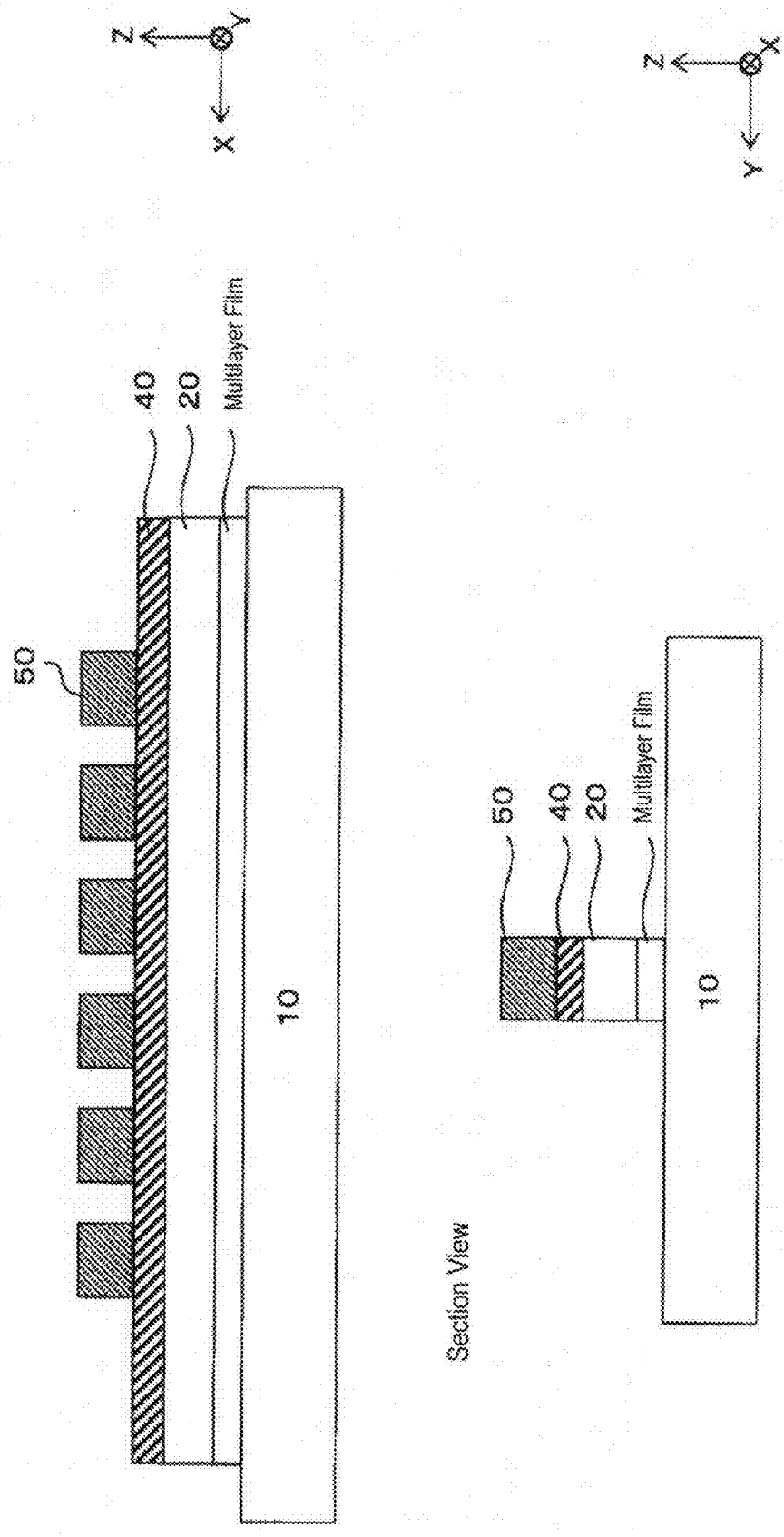

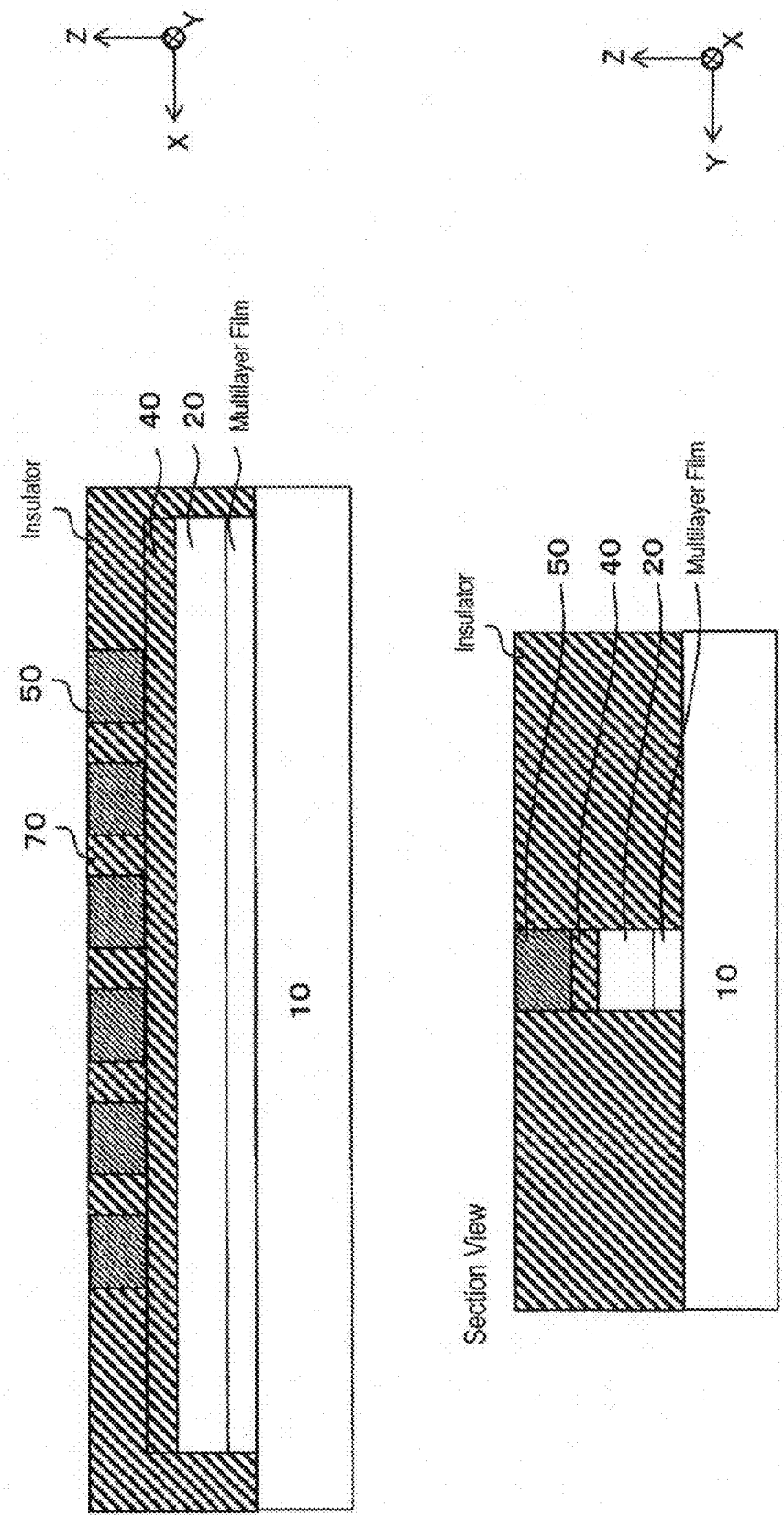

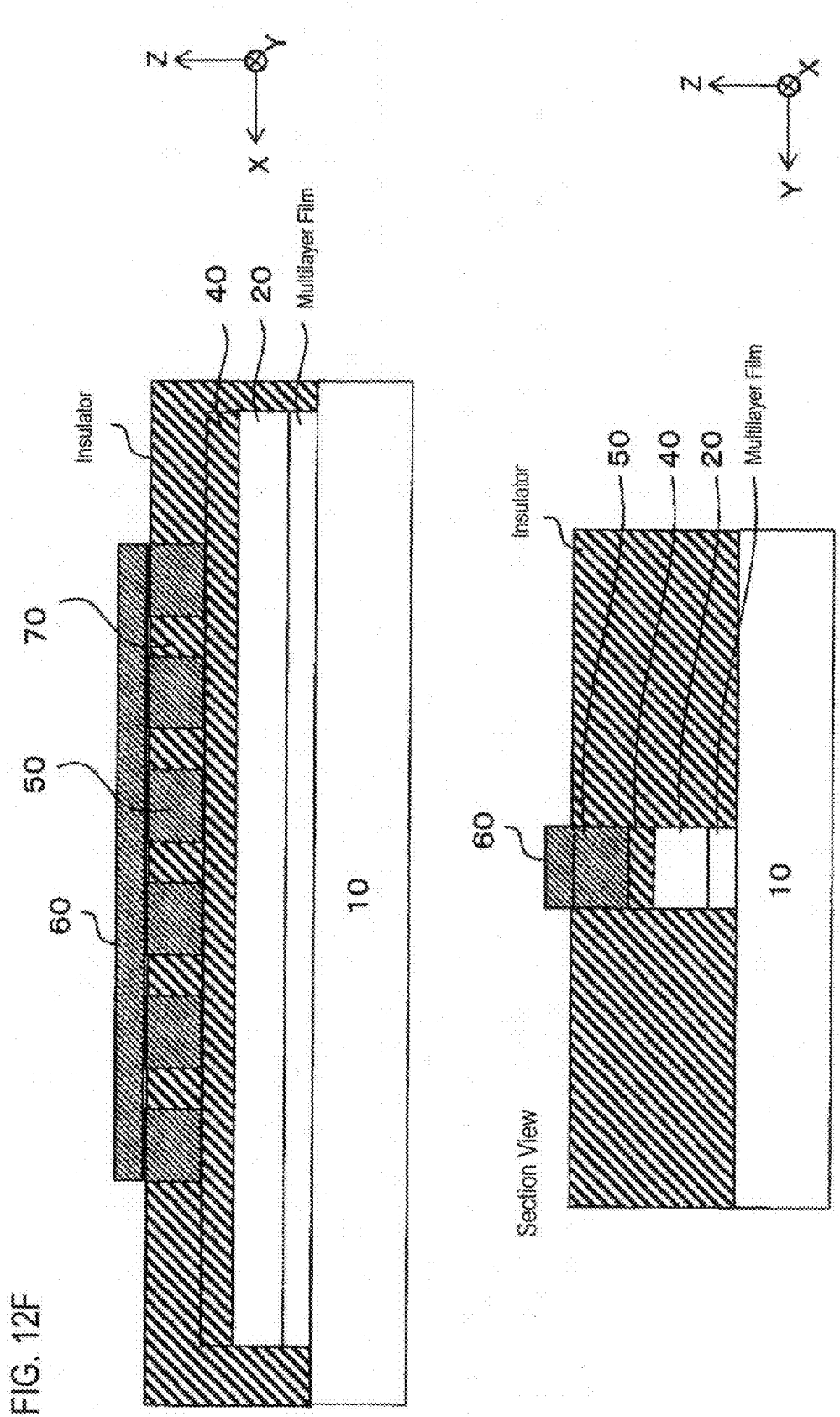

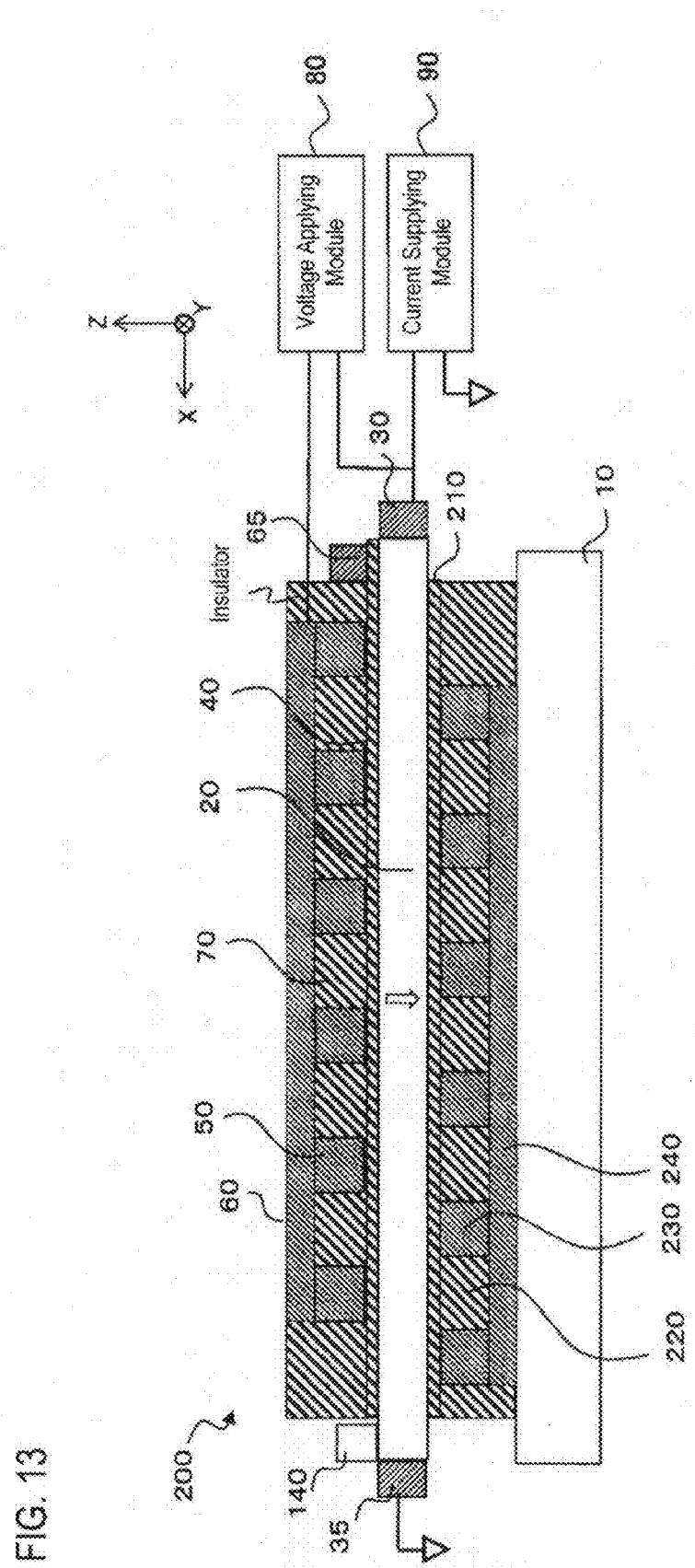

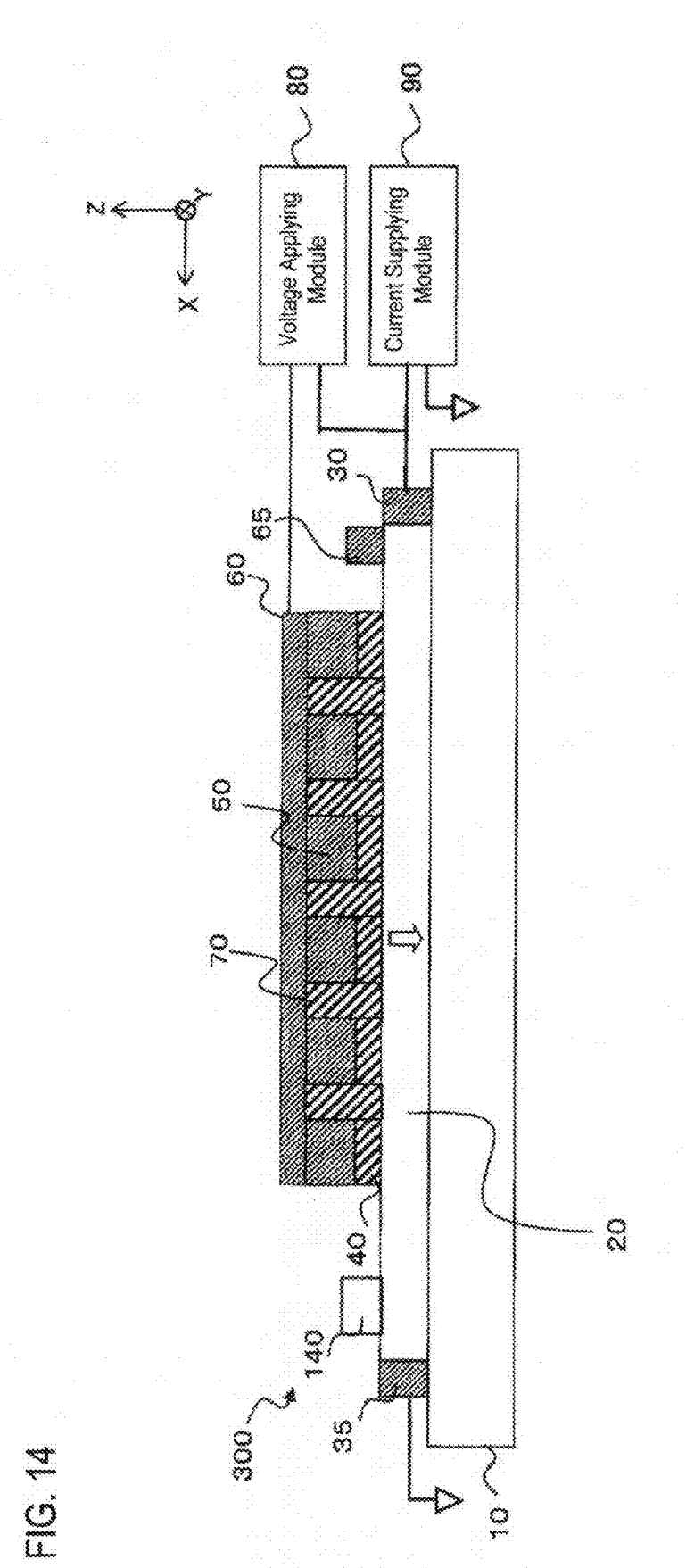

MAGNETIC MEMORY

CROSS-REFERENCE TO RELATED APPLICATION(S)

The present disclosure claims priority to Japanese Patent Application No. 2012-209152, filed on Sep. 24, 2012, which is incorporated herein by reference in its entirety.

FIELD

Embodiments described herein relate generally to a magnetic memory.

BACKGROUND

Devices for recording information using magnetic domain structures in a magnetic wire have been proposed. In recent years, it has been found experimentally that positions of magnetic domain walls can be changed by a current. Realization of magnetic memories using magnetic wires is now expected. The term "domain wall" means a boundary between magnetic domains having different magnetization directions.

A magnetic domain wall in a magnetic wire can easily be moved by applying, for example, a magnetic field thereto externally if its constituent materials are in an ideal state in terms of uniformity and shape. Therefore, to use a magnetic wire to form a magnetic memory, means that fixes a magnetic domain wall at an intended position is necessary. On the other hand, if the position of a magnetic domain wall is fixed too strongly, a large drive current is necessary to move it. This may make it impossible to design a magnetic memory that is functional. In view of this, a method for controlling domain wall motion in a magnetic wire by dynamically changing magnetic energy with respect to a magnetic domain wall using an electric field has been proposed. However, it is difficult to control domain wall motion with high accuracy using an electric field because the magnetic energy may be rendered unstable.

BRIEF DESCRIPTION OF THE DRAWINGS

FIG. 1 shows the configuration of a magnetic memory according to a first embodiment;

FIGS. 2A and 2B show the configurations of input modules of the magnetic memory according to the first embodiment;

FIG. 6 shows how to control domain wall motion in the magnetic memory according to the first embodiment;

FIG. 7 shows the configuration of a detector of the magnetic memory according to the first embodiment;

FIG. 8 shows how to control domain wall motion in the magnetic memory according to the first embodiment;

FIGS. 9A to 9H show a writing operation in the magnetic memory according to the first embodiment;

FIGS. 10A to 10F show a reading operation in the magnetic memory according to the first embodiment;

FIGS. 12A to 12F show a manufacturing method of the magnetic memory according to the first embodiment;

FIG. 13 shows the configuration of a magnetic memory according to a first modification example;

FIG. 14 shows the configuration of a magnetic memory according to a second modification example.

DETAILED DESCRIPTION

Figure 3:
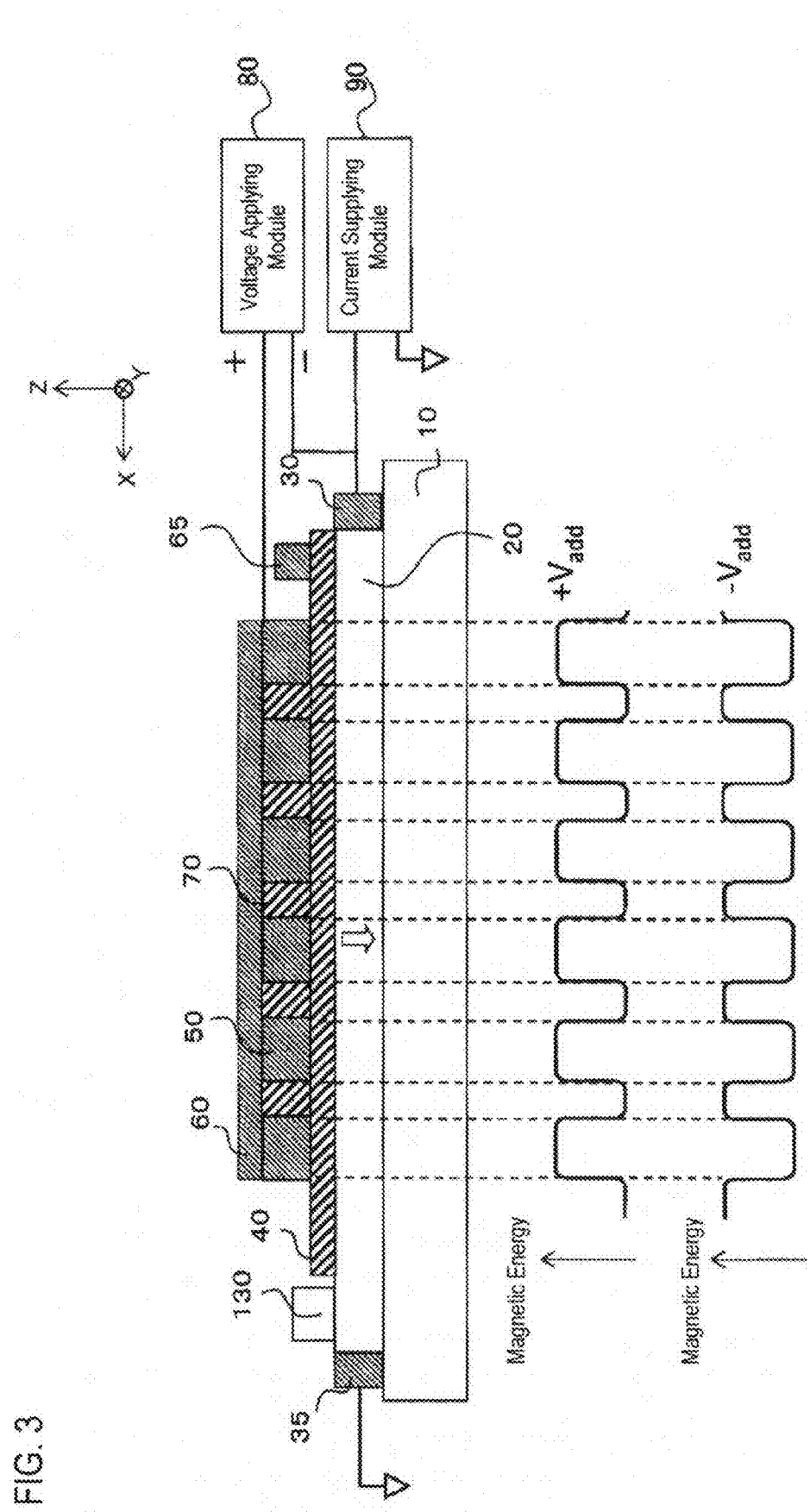
FIG. 3 shows how to control domain wall motion in the magnetic memory according to the first embodiment.

According to one embodiment, a magnetic memory includes a magnetic wire, a first insulating layer, plural first electrodes, a second electrode, a current supplying module, and a voltage applying module. The magnetic wire includes a first portion and a second portion. The magnetic wire has a first electric resistance value between the first portion and the second portion. The magnetic wire is configured to form plural magnetic domains which are separated from each other by magnetic domain walls. The first insulating layer is formed on the magnetic wire. The plural first electrodes are formed on the first insulating layer, arranged along the magnetic wire, and spaced from each other. The second electrode includes a third portion and a fourth portion. The third portion is closer to the first portion than the second portion. The fourth portion is closer to the second portion than the first portion. The second electrode is electrically connected to the plural first electrodes between the third portion and the fourth portion and has a second electric resistance value being larger than the first electric resistance value. The current supplying module is configured to supply the magnetic wire with a pulse current flowing from the first portion to the second portion. The voltage applying module is configured to apply, between the second portion and the fourth portion, a voltage that decreases with time.

Embodiments will be hereinafter described with reference to the accompanying drawings. The same or similar items will be given the same reference symbol. The drawings are schematic or conceptual, and hence the relationship between the thickness and the width of each member, the ratio between the dimensions of different members, and the like are not always the same as actual ones. Furthermore, in different drawings, even the same member may be drawn in different sizes or the ratio between dimensions of even the same member may be drawn differently.

First Embodiment

FIG. 1 shows a magnetic memory 100. An upper part of FIG. 1 is a section view of the magnetic memory 100 taken along a line A-A' in a lower part of FIG. 1. The lower part of FIG. 1 is a top view of the magnetic memory 100. In FIG. 1, X, Y, and Z axes are perpendicular to each other.

The magnetic memory 100 has a magnetic wire 20, a pair of a first electrode 30 and a second electrode 35 which are provided for the magnetic wire 20, a first insulating layer 40 formed on the magnetic wire 20, plural third electrodes 50 formed on the first insulating layer 40 along the magnetic wire 20 so as to be spaced from each other, and a fourth electrode 60 which extends along the magnetic wire 20 and is electrically connected to the plural third electrodes 50. The magnetic memory 100 also includes a voltage applying module 80 configured to apply a voltage that decreases monotonously with time (temporally) between one end (fourth portion) E1 of the fourth electrode 60 and one end (second portion) E3, being closest to the end E1 of the fourth electrode 60, of the magnetic wire 20, a current supplying module 90 connected to the magnetic wire 20, an electrode 65 formed on the first insulating layer 40, a magnetic field generator 95 connected to the electrode 65, and a detector 130 that is formed on the magnetic wire 20 and is configured to detect a magnetization direction.

Adjoining ones of the third electrodes 50 are insulated from each other by a second insulating layer 70. A multilayer film such as a Ta/Ru/Ta lamination film may be formed between the magnetic wire 20 and a substrate 10.

The magnetic wire 20 is provided on the substrate 10 and is a conductive member extending in the X-axis direction. It is preferable that the magnetic wire 20 be made of a ferromagnetic material, a ferrimagnetic material, or an artificial lattice material.

For example, the ferromagnetic material as a material of the magnetic wire 20 include alloys of at least one element selected from iron (Fe), cobalt (Co), nickel (Ni), manganese (Mn), and chromium (Cr) and at least one element selected from platinum (Pt), palladium (Pd), iridium (Ir), ruthenium (Ru), and rhodium (Rh). More specific examples of the ferromagnetic material include CoPt, NiFe, and CoCrPt. The properties of a ferromagnetic material can be changed by a composition change, a heat treatment, etc.

For example, the ferrimagnetic materials as a material of the magnetic wire 20 include amorphous alloys of a rare earth element and a transition metal such as TbFeCo and GdFeCo. These materials have a tendency that the magnetization is directed in the Z-axis direction (lamination direction) when deposited as a thin film by a sputtering machine under particular fabrication conditions. Therefore, these materials can be used when it is desired to set the magnetization direction of the magnetic wire 20 in the Z-axis direction.

For example, the artificial lattice materials as a material of the magnetic wire 20 include ones having a lamination structure such as Co/Pt, Co/Pd, and Co/Ni. The use of such materials having the lamination structure makes it possible to set the magnetization direction of the magnetic wire 20 in the Z-axis direction. These materials having the lamination structure tend to have the <0001> orientation of the close-packed hexagonal lattice structure or the <111> orientation of the face-centered cubic lattice structure.

For example, materials of each of the first insulating layer 40 and the second insulating layer 70 include oxides, nitrides, fluorides, oxynitrides, etc. containing at least one element selected from aluminum (Al), titanium (Ti), zinc (Zn), zirconium (Zr), tantalum (Ta), cobalt (Co), nickel (Ni), silicon (Si), magnesium (Mg), and iron (Fe). It is preferable that the relative permittivity of the first insulating layer 40 be larger than that of the second insulating layer 70. Also, it is preferable that the second insulating layer 70 be thicker than the first insulating layer 40 in the Z-axis direction. This is because in these conditions, charges are more apt to be distributed between the magnetic wire 20 and the third electrodes 50 when a voltage is applied between the magnetic wire 20 and the third electrodes 50. Oxides, fluorides, and nitrides tend to exhibit smaller relative permittivity values as they contain a larger amount of light element. Therefore, the first insulating layer 40 and the second insulating layer 70 can be given different relative permittivity values by forming the first insulating layer 40 with MgO and forming the second insulating layer 70 with $SiO_2$.

The first electrode 30, the second electrode 35, the third electrodes 50, and the fourth electrode 60 are conductive members. For example, materials of the first electrode 30, the second electrode 35, the third electrodes 50, and the fourth electrode 60 include at least one element selected from copper (Cu), gold (Au), silver (Ag), and aluminum (Al). The third electrodes 50 and the fourth electrode 60 may be made of an alloy of these elements.

The first electrode 30 is formed at the one end (second portion) E3 of the magnetic wire 20. The second electrode 35 is formed at the other end (first portion) E4 of the magnetic wire 20.

The electric resistance of the fourth electrode 60 between its two ends in the X-axis direction is larger than that of the magnetic wire 20 between the first electrode 30 and the second electrode 35 which are formed on its two respective ends. More specifically, as described later, it is preferable that the electric resistance of the fourth electrode 60 be 10 times or more as large as that of the magnetic wire 20.

For example, in order to satisfy the above condition, the thickness of the fourth electrode 60 in the Z-axis direction may be smaller than 5 nm. The fourth electrode 60 may contain fine particles that are made of an oxide, a nitride, a fluoride, an oxynitride, or the like containing at least one element selected from aluminum (Al), titanium (Ti), zinc (Zn), zirconium (Zr), tantalum (Ta), cobalt (Co), nickel (Ni), silicon (Si), magnesium (Mg), and iron (Fe).

The voltage applying module 80 is connected to the end E1 of the fourth electrode 60 and the first electrode 30. The voltage applying module 80 is configured to apply the voltage, which decreases monotonously with time (temporally) between the fourth electrode 60 and the first electrode 30, that is, between the magnetic wire 20 and the third electrodes 50.

The current supplying module 90 is connected to the first electrode 30. The current supplying module 90 is configured to cause a pulse current to flow through the magnetic wire 20 (between the first electrode 30 and the second electrode 35) so as to move a magnetic domain wall of the magnetic wire 20. The term "magnetic domain" means a region in which the magnetization direction is uniform. In a boundary between two adjoining domains, the magnetization direction varies continuously in the extending direction of the magnetic wire 20. Such a region in which the magnetization direction varies is called a magnetic domain wall.

The magnetic field generator 95 is configured to generate a magnetic field by causing a current to flow through the electrode 65 and to have the generated magnetic field act on the magnetic wire 20 so as to invert the magnetization directions of portions of the magnetic wire 20. Magnetic domain walls are formed in the magnetic wire 20 as a result of the inversion of the magnetization directions. By changing magnetization directions of the magnetic wire 20, the magnetic field generator 95 writes, into the magnetic wire 20, information corresponding to a combination of magnetization directions.

The magnetic field generator 95 may be configured to write information into the magnetic wire 20 using an input module 110 or 120 shown in FIGS. 2A and 2B instead of the electrode 65.

FIG. 2A shows the input module 110

The input module 110 has a spacer layer 71, a ferromagnetic layer 52, an antiferromagnetic layer 53, and an electrode 54 which are stacked on the magnetic wire 20. Also, an electrode 72 is formed on the opposite side, of the magnetic wire 20, to the side where the input module 110 is provided. A non-magnetic layer etc. may be formed between the magnetic wire 20 and the electrode 72.

The spacer layer 71 may be made of a tunneling insulting film material or a non-magnetic metal material.

Examples of the tunneling insulting film material includes oxides, nitrides, fluorides, oxynitrides, etc. containing at least one element selected from aluminum (Al), titanium (Ti), zinc (Zn), zirconium (Zr), tantalum (Ta), cobalt (Co), nickel (Ni), silicon (Si), magnesium (Mg), and iron (Fe). Other examples include semiconductor materials having a large energy gap such as AlAs, GaN, AlN, ZnSe, ZnO, and MgO.

Examples of the non-magnetic metal material include copper (Cu), gold (Au), silver (Ag), and aluminum (Al). Also, alloys of combinations of these elements may be used.

FIG. 2B shows the input module 120. The input module 120 is configured to operate on the same principle as the input module 110 but is different from the input module 110 in configuration.

The input module 120 has the spacer layer 71, the ferromagnetic layer 52, an intermediate layer 61, a ferromagnetic layer 62, and the electrode 54 which are stacked on the magnetic wire 20.

In the case where the input module 110 or the input module 120 is used, the magnetic field generator 95 causes a current to flow from the electrode 54 to the electrode 72, whereby magnetization directions of the magnetic wire 20 are changed and information can be written into the magnetic wire 20.

FIG. 3 shows a magnetic energy distribution in the magnetic wire 20 which occurs when a constant voltage is applied between the magnetic wire 20 and the third electrodes 50.

FIG. 3 includes magnetic energy state diagrams (two patterns) of the magnetic wire 20 after sufficient time has elapsed since it is started to apply the voltage. The first diagram shows a case where a voltage $+V_{add}$ is applied in such a manner that potentials of the third electrodes are higher than that of the magnetic wire 20. That is, the third electrodes 50 are charged positively, and the magnetic wire 20 is charged negatively. The second diagram shows a case where a voltage $-V_{add}$ is applied in such a manner that potentials of the third electrodes 50 are lower than on that of the magnetic wire 20. That is, the third electrodes 50 are charged negatively, and the magnetic wire 20 is charged positively.

For example, the magnitude of the voltage $V_{add}$ is about 3 V in the case where the first insulating layer 40 is 3 nm in thickness and an amount of change in interface-induced magnetic anisotropy between the first insulating layer 40 and the magnetic wire 20 in response to a voltage is about 0.06 erg/$cm^{-2}$ (1 V/nm). It is desirable that $V_{add}$ does not exceed 10 V because too large a booster circuit is disadvantageous in terms of the degree of integration.

In a state where no voltage is applied to the magnetic wire 20 (equilibrium state), magnetization directions formed in the magnetic wire 20 are perpendicular to the extending direction of the magnetic wire 20 so that a sum of (i) magnetostatic energy which is determined by the Y-Z sectional shape of the magnetic wire 20 and depends on the magnetization direction and (ii) magnetic energy which is caused by electron states at the interface between the first insulating layer 40 and the magnetic wire 20 is minimized.

In the case where a voltage is applied by the voltage applying module 80 so that the third electrodes 50 are charged positively and the magnetic wire 20 is charged negatively (corresponding to the first state diagram of FIG. 3), portions of the magnetic wire 20 which are right under the third electrodes 50 have higher magnetic energy with respect to a magnetic domain wall than the other portions of the magnetic wire 20, that is, the portions right under the second insulating layer 70. Therefore, when it is attempted to move the magnetic domain wall by causing a current to flow through the magnetic wire 20, the magnetic domain wall is moved easily from a portion, right under the third electrode 50, of the magnetic wire 20 toward a portion, right under the second insulating layer 70, of the magnetic wire 20.

On the other hand, the magnetic domain wall is not moved from the portion, right under the second insulating layer 70, of the magnetic wire 20 toward the portion, right under the third electrode 50, of the magnetic wire 20. This is because the voltage which is applied between the magnetic wire 20 and the third electrodes 50 forms potential barriers which obstruct movement of the magnetic domain wall. The magnetic domain wall can be moved in this direction by causing a flow of a current that is large enough to produce energy that is higher than the potential barriers. However, it becomes difficult to control the movement of the magnetic domain wall.

In the case where a voltage is applied by the voltage applying module 80 so that the third electrodes 50 are charged negatively and the voltage applying module 80 is charged positively (corresponding to the second state diagram of FIG. 3), the portions, right under the third electrodes 50, of the magnetic wire 20 have lower magnetic energy with respect to the magnetic domain wall than the portions, right under the second insulating layer 70, of the magnetic wire 20. Therefore, when it is attempted to move the magnetic domain wall by causing a current to flow through the magnetic wire 20, the magnetic domain wall is not moved from a portion, right under the third electrode 50, of the magnetic wire 20 toward a portion, right under the second insulating layer 70, of the magnetic wire 20. On the other hand, the magnetic domain wall is moved easily from the portion, right under the second insulating layer 70, of the magnetic wire 20 toward the portion, right under the third electrode 50, of the magnetic wire 20.

In this manner, in the magnetic memory 100, the voltage applying module 80 applies a voltage between the magnetic wire 20 and the third electrodes 50 so that the magnetic energy increases and decreases repeatedly in the magnetic wire 20. Movement of the magnetic domain wall is controlled utilizing this magnetic energy variation.

Figure 4:
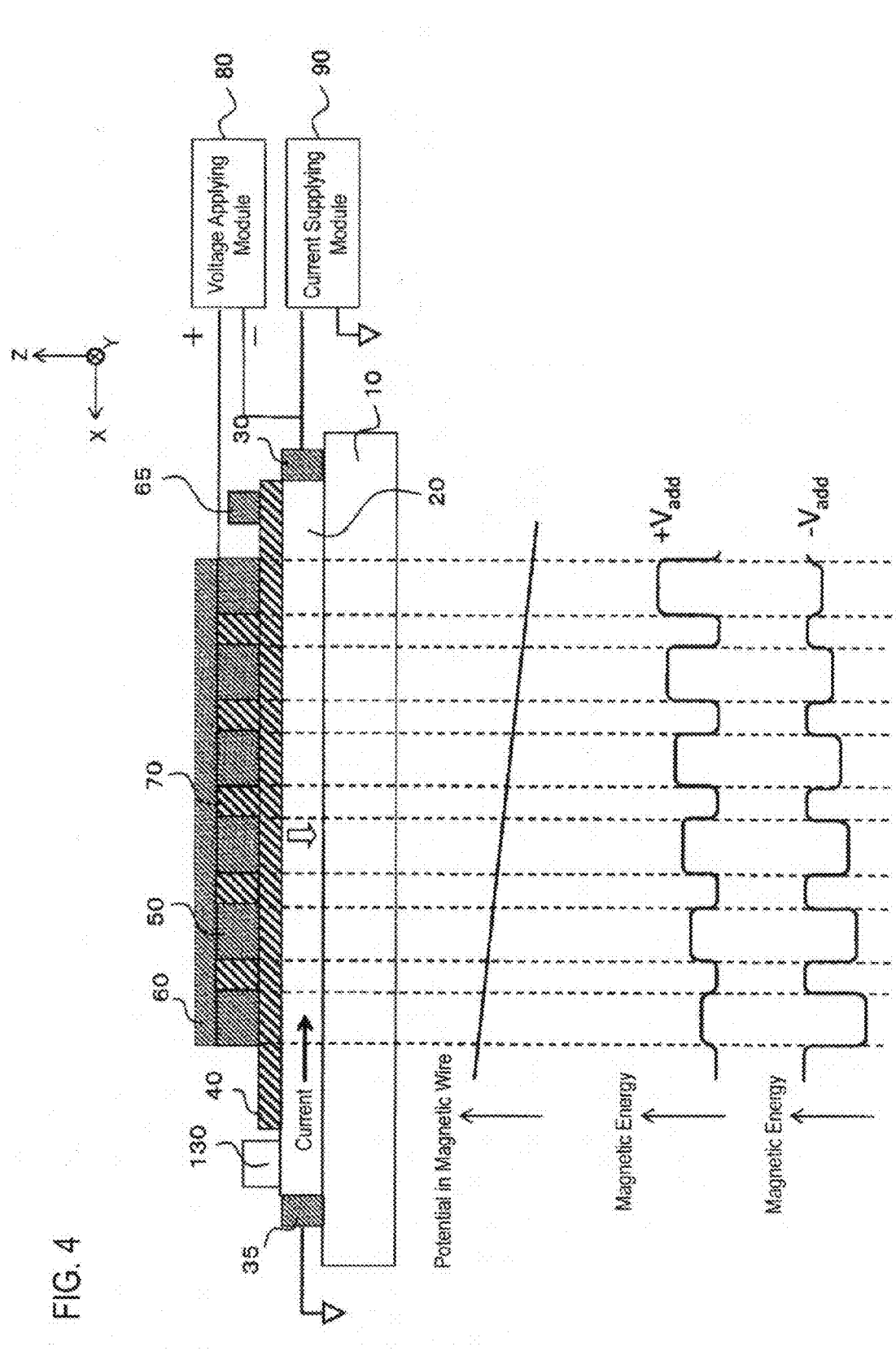
FIG. 4 shows how to control domain wall motion in the magnetic memory according to the first embodiment.

When a current is caused to flow through the magnetic wire 20, an electric potential gradient occurs in the magnetic wire 20 due to a voltage drop as shown in FIG. 4. Where the magnetic wire 20 is long or has a small section area, the voltage drop is approximately equal to the voltage applied between the magnetic wire 20 and the third electrodes 50, which results in that the modulation of the magnetic energy with respect to the magnetic domain wall is non-uniform as shown in FIG. 4. This makes it difficult to control the movement of the magnetic domain with high accuracy. For example, a voltage drop of 2 V occurs when a current of 10 μA is caused to flow through the magnetic wire 20 which is 10 μm in length, 100 $nm^2$ in section area, and 200 kΩ in resistance.

Figure 5:
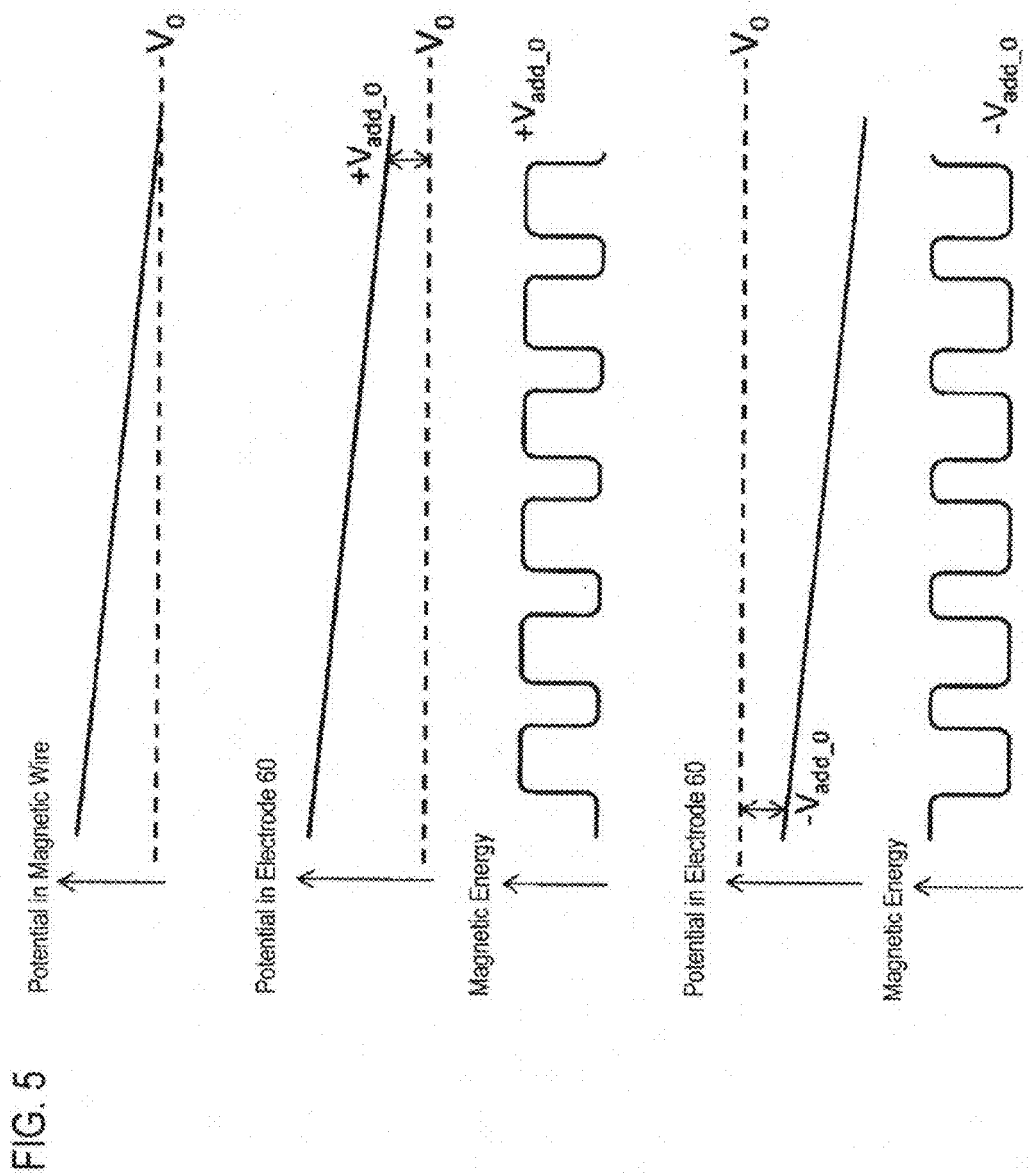
FIG. 5 shows how to control domain wall motion in the magnetic memory according to the first embodiment.

This difficulty can be avoided by forming approximately the same electric potential distribution in the fourth electrode 60 as in the magnetic wire 20 (see FIG. 5). As shown in FIG. 5, the non-uniformity of the modulation of the magnetic energy with respect to the magnetic domain wall can be eliminated by forming approximately the same electric potential gradient in the fourth electrode 60 as in the magnetic wire 20.

An electric potential distribution capable of compensating for the voltage drop in the magnetic wire 20 can be formed relatively easily in the fourth electrode 60 by making the electric resistance of the fourth electrode 60 extremely larger than that of the magnetic wire 20 as described above.

In general, the time of transmission of an electric signal (voltage) through a thin wire is approximately proportional to the product of the resistance of the thin wire and the parasitic capacitance thereof. Since the fourth electrode 60 and the magnetic wire 20 of the magnetic memory 100 share the first insulating layer 40, the ratio of the speed of an electrical signal traveling through the magnetic wire 20 to that of an electrical signal traveling through the fourth electrode 60 should be approximately the same as their resistance ratio. Therefore, the difference between the electrical signal traveling speeds can be increased by making only the electric resistance of the fourth electrode 60 larger.

For example, when the fourth electrode 60 is 10 nm in width and 5 μm in length and the first insulating layer 40 is made of MgO and is about 200 MΩ in electric resistance, the electrical signal traveling time of the fourth electrode 60 is about 230 ns. On the other hand, the electrical signal traveling time of the magnetic wire 20 can be set to about 1 ns. The electric potential distribution shown in FIG. 5 can be realized in the fourth electrode 60 by setting a large difference between the electrical signal traveling speeds of the two lines and applying a voltage that changes with time as shown in FIG. 6 to the fourth electrode 60.

In the case where the electrical signal traveling speeds have a large difference therebetween (230:1) as described above, if the timing between the voltage application to the fourth electrode 60 and that to the magnetic wire 20 can be controlled accurately and the pre-assumed number of bits to be stored in the magnetic wire 20 is 200, the distance by which the electric potential spatial distribution in the fourth electrode 60 is shifted while a current flows for 1 ns is shorter than a bit length (recording length). Therefore, a normal operation is expected.

On the other hand, if the accuracy of timing control is as low as about 1 ns for reasons relating to peripheral circuits, it is necessary to decrease the number of bits to be stored in a single magnetic wire 20 to about 100 by increasing the recording length.

As shown in FIG. 7, for example, the detector 130 has a tunneling insulating film 131 formed on the magnetic wire 20 and a ferroelectric layer 132 which is formed on the tunneling insulating film 131 and is magnetized downward on the sheet of FIG. 7. To detect magnetization information, a current is caused to flow from the ferroelectric layer 132 toward the substrate 10. Magnetization information stored in the magnetic wire 20 is read out using a voltage drop $V_{out}$ which occurs due to magnetoresistance.

Next, description will be given on how the magnetic memory 100 operates.

Referring to FIG. 6, $V_0$ represents an electric potential at the right end E3 of the magnetic wire 20 when the current is caused to flow.

First, at time $T_0$, a voltage obtained by adding the voltage for compensating for the voltage drop in the magnetic wire 20 and a voltage $\pm V_{add\_0}$ which is necessary for suppressing the domain wall from moving is applied to the right end E1 of the fourth electrode 60. Then, the voltage is lowered gradually. The voltage lowering rate is set so that the voltage at the right end E1 of the fourth electrode 60 becomes approximately equal to $+V_{add\_0}$ at time $T_1$ at which the voltage first reaches the left end E2 of the fourth electrode 60.

By applying the above-described voltage, which changes with time, to the fourth electrode 60, an electric potential distribution is formed in the fourth electrode 60 in such a manner that the electric potential decreases monotonously in space from the right end E1 to the left end E2 of the fourth electrode 60 as shown in FIG. 5. As shown in FIG. 6, at this time point, a pulse current is caused to flow through the magnetic wire 20. Thereby, the magnetic energy with respect to the magnetic domain wall is modulated uniformly over almost the entire magnetic wire 20 even with the voltage drop and stable domain wall motion is realized. Although in the above description it is assumed that the pulse current traveling speed is sufficiently higher than the voltage traveling speed, the pulse current generation timing may be adjusted taking the pulse current traveling speed into consideration. That is, the current supplying module 90 starts to supply the pulse current in synchronism with a timing at which the voltage first reaches the left end E2 of the fourth electrode 60. The term "synchronism" means that, for example, the timing at which the voltage first reaches the left end E2 of the fourth electrode 60 matches a timing at which the pulse current reaches to the right end E3 of the magnetic wire 20. It is noted that these timings don't necessarily match in a strict manner. That is, although timing deviation causes errors in the high/low level difference of the magnetic energy, the errors are allowable so long as they fall within a predetermined reference value over the entire magnetic wire 20. The timing deviation is allowable so long as the errors are within such a range. The reference value can be set appropriately at a value that enables stable control of the movement of the magnetic domain wall by taking, for example, the magnitude of the pulse current and the application duration of the pulse current into consideration.

The voltage application to the fourth electrode 60 is continuously swept as shown in FIG. 6. The applied voltage at the right end E1 of the fourth electrode 60 becomes $-V_{add\_0}$, and then such an applied voltage reaches the left end E2 of the fourth electrode 60 at time T2. At this time point (i.e., at time T2), a second pulse current is supplied to the magnetic wire 20. In the same manner as described above, the current supplying module 90 supplies the second pulse current in synchronism with a timing at which the voltage $-V_{add\_0}$ reaches the left end E2 of the fourth electrode 60. By following this procedure, the magnetic domain wall can be moved with the magnetic energy modulation being shifted by a half cycle.

Since it suffices that the electric potential distribution that decreases monotonously in space from the left end E2 to the right end E1 of the fourth electrode 60 be established, the voltage applying module 80 may be connected between the left end (third portion) E2 of the fourth electrode 60 and the second electrode 35 and apply a voltage that increases monotonously in time between the left end E2 of the fourth electrode 60 and the second electrode 35.

FIG. 8 illustrates how the magnetic domain wall is moved in the magnetic wire 20 utilizing the application of the voltage to the fourth electrode 60 and the supply of the pulse currents to the magnetic wire 20 which have been described above with reference to FIG. 6. Each diagram of FIG. 8 shows a distribution of the magnetic energy with respect to the magnetic domain wall in the magnetic wire 20 and a position of the magnetic domain wall. The uppermost diagram of FIG. 8 shows how the magnetic domain wall is formed in the magnetic wire 20 in a first state (time $T_1$). The diagrams corresponding to the first state ($T_1$), a second state ($T_2$), a third state ($T_3$), and a fourth state ($T_4$) are arranged downward with progress of time. FIG. 8 shows an example in which there are six third electrodes 60.

In the first state (T1), the magnetic domain wall exists between the first third electrode 50 and the second third electrode 50. Furthermore, the voltage, which changes with time as shown in FIG. 6, is applied to the right end E1 of the fourth electrode 60 from time $T_0$ Therefore, at time $T_1$, the electric potential distribution which is high on the left side and low on the right side is formed in the fourth electrode 60 as shown in FIG. 5. At this time point, the pulse current having a magnitude $I_{c0}$ is supplied to the magnetic wire 20, whereupon the voltage drop in the magnetic wire 20 and the electric potential distribution in the fourth electrode 60 cancel out each other and approximately the same voltages are applied between the magnetic wire 20 and the individual third electrodes 50. As a result, the magnetic energy with respect to the magnetic domain wall is modulated uniformly as shown in FIG. 8. The portions, right under the third electrodes 50, of the magnetic wire 20 have higher magnetic energy with respect to the magnetic domain wall than the other portions have. Therefore, in order to move the magnetic domain wall, it is necessary to cause a current $I_{c1}$ to flow that is larger than the current $I_{c0}$ which is necessary to move the magnetic domain wall in an equilibrium state ($0<I_{c0}<I_{c1}$). That is, even if a current that is between $I_{c0}$ and $I_{c1}$ in magnitude ($I_{c0}<I_c<I_{c1}$) is caused to flow through the magnetic wire 20 in this state, the magnetic domain wall is only moved to short of the second third electrode 50.

The operation performed so far will be called operation A.

In contrast, when a pulse current having the magnitude $I_{c0}$ is caused to flow through the magnetic wire 20 while the voltage which changes with time as shown in FIG. 6 is applied to the right end E1 of the fourth electrode 60 so that the electric potential of the fourth electrode 60 is lower than that of the magnetic wire 20, the current acts on the magnetic domain wall in a state where the potential barriers have been moved by the electrode width W (W>0). Therefore, the magnetic domain wall in the magnetic wire 20 is moved to the left end of the second third electrode 50 on the sheet of FIG. 8. Then, the movement of the magnetic domain wall in the magnetic wire 20 is stopped by the potential barrier (second state).

The operation performed so far from the end of operation A will be called operation B.

Next, at time $T_3$, a pulse current having the magnitude $I_{c0}$ is caused to flow through the magnetic wire 20 after the same voltage as applied at time $T_1$ is again applied to the right end E1 of the fourth electrode 60 and the voltage decreases monotonously in time. Thereby, the potential barriers are moved by the electrode width W (W>0). As a result, the magnetic domain wall in the magnetic wire 20 is stopped at a position between the second third electrode 50 and the third third electrode 50 (third state).

As described above, the magnetic domain wall can be moved in synchronism with an external signal by applying the voltage and supplying the current repeatedly. To prevent reverse movement of the magnetic domain wall, it is preferable that switching from operation B to operation A be performed at timing when the magnetic domain wall has just reached a potential barrier.

Next, an operation of writing plural bits into the magnetic memory 100 will be described. This operation is a combination of the operation for moving the magnetic domain wall and an operation for inverting magnetization.

FIGS. 9A to 9H illustrate the operation for writing into the magnetic memory 100. In FIGS. 9A to 9H, the first electrode 30 and the second electrode 35 are omitted. The writing operation will be described with reference to FIGS. 9A to 9H in this order. It is assumed that in the magnetic wire 20 a magnetic domain whose magnetization direction is downward in each figure (downward in the Z-axis direction) corresponds to data "0" and a magnetic domain whose magnetization direction is upward in the figure (upward in the Z-axis direction) corresponds to data "1." In FIGS. 9A to 9H, it is further assumed that the number of third electrodes 50 is six. In this case, the magnetic memory 100 can store information of 6 bits. It should be noted that the number of third electrodes 50 is not limited to six. In FIGS. 9A to 9H, the third electrodes 50 will be called a first third electrode, a second third electrode, . . . , a sixth third electrode as the position goes from right to left.

Figure 9A:
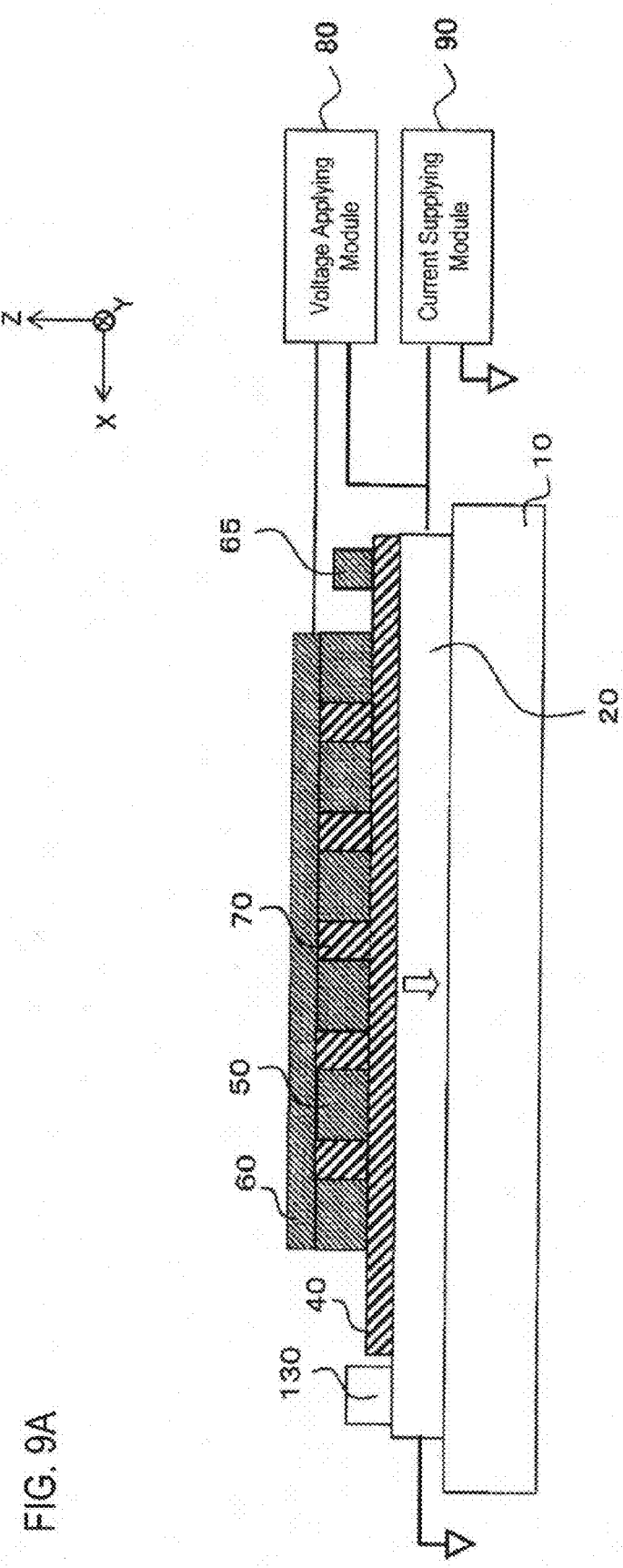

In an initial state, the magnetization direction is downward in the entire magnetic wire 20 as shown in FIG. 9A. That is, data '000000' are stored in the magnetic memory 100.

First, to prevent a magnetic domain wall from being moved at once from the right end of the magnetic wire 20 to the left end of the magnetic wire 20, a voltage $+V_{add}$ is applied so that the electric potentials of the third electrodes 50 are higher than that of the magnetic wire 20. Then, as shown in FIG. 9B, a current is caused to flow through the electrode 65 to generate an induced magnetic field around the electrode 65. The induced magnetic filed forms a magnetic domain whose magnetization direction is upward in FIG. 9B in a portion, on the right side of the first third electrode 50, of the magnetic wire 20. The magnetic domain having the upward magnetization direction tends to expand leftward in FIG. 9B. However, the potential barrier formed by the voltage $+V_{add}$ prevents the expansion of the magnetic domain having the upward magnetization direction.

Then, the operation A and the operation B (described above) are performed in this order. Thereby, as shown in FIG. 9C, a magnetic domain wall in the magnetic wire 20 is moved to short of the second third electrode 50. As a result, the portion, right under the first third electrode 50, of the magnetic wire 20 has an upward magnetization direction.

Figure 9D:
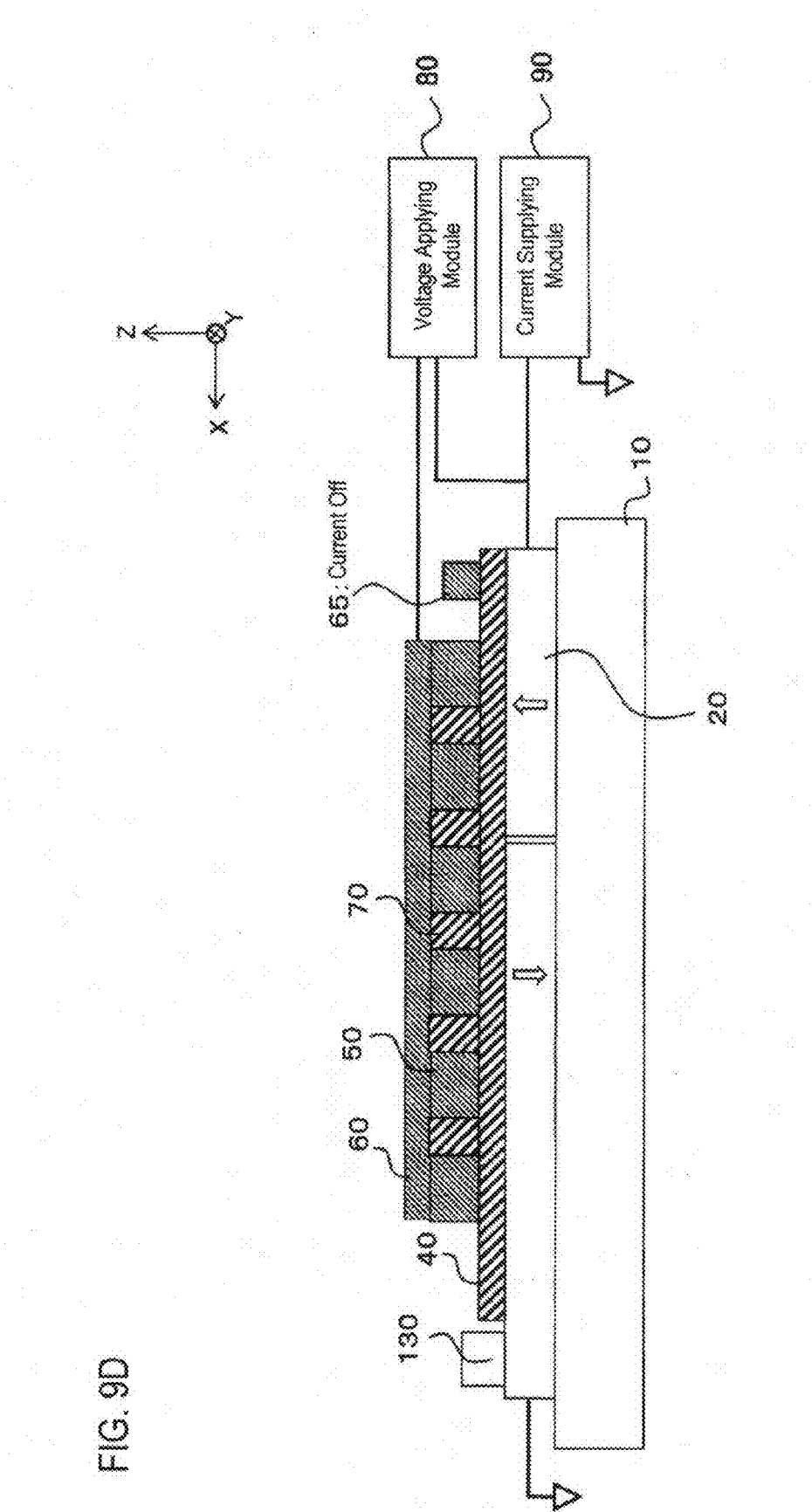

Then, the operation A and the operation B are performed again in this order. Thereby, as shown in FIG. 9D, the magnetic domain wall in the magnetic wire 20 is moved to short of the third third electrode 50. In this state, data recorded in the magnetic memory 100 indicates '000011.'

Then, as shown in FIG. 9E, a current is caused to flow through the electrode 65 in the opposite direction to the direction shown in FIG. 9B to generate an induced magnetic field around the electrode 65. This induced magnetic field forms a magnetic domain having a downward magnetization direction in the portion, on the right side of the first third electrode 50, of the magnetic wire 20.

Then, the operation A and the operation B are performed in this order. Furthermore, as shown in FIG. 9F, a current is caused to flow through the electrode 65 in the same direction as that shown in FIG. 9B to generate an induced magnetic field around the electrode 65. The induced magnetic filed forms a magnetic domain having an upward magnetization direction in the portion, on the right side of the first third electrode 50, of the magnetic wire 20. In this state, data recorded in the magnetic memory 100 indicates '000110.'

Figure 9G:
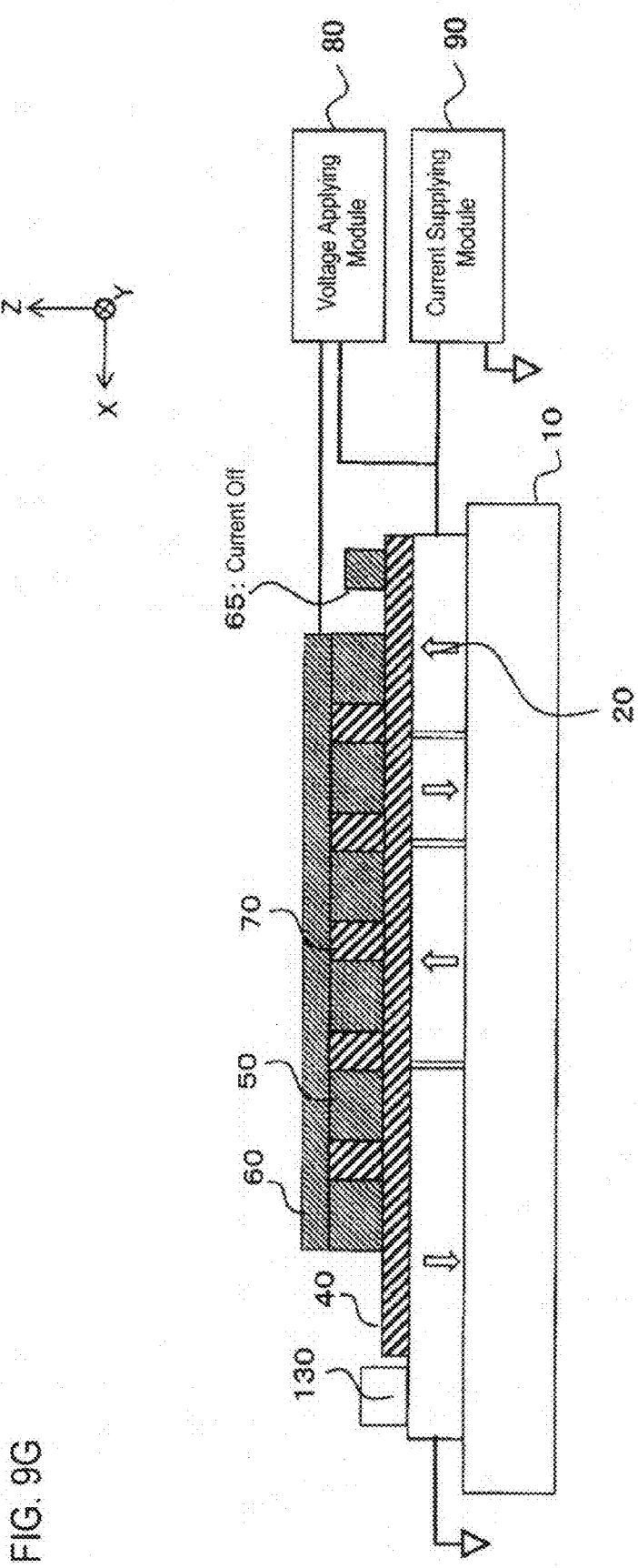

Then, the operation A and the operation B are performed in this order (see FIG. 9G). In this state, data recorded in the magnetic memory 100 indicates '001101.'

Finally, the operation A and the operation B are performed in this order (see FIG. 9H). In this state, data recorded in the magnetic memory 100 indicates '011011.'

Figure 10D:
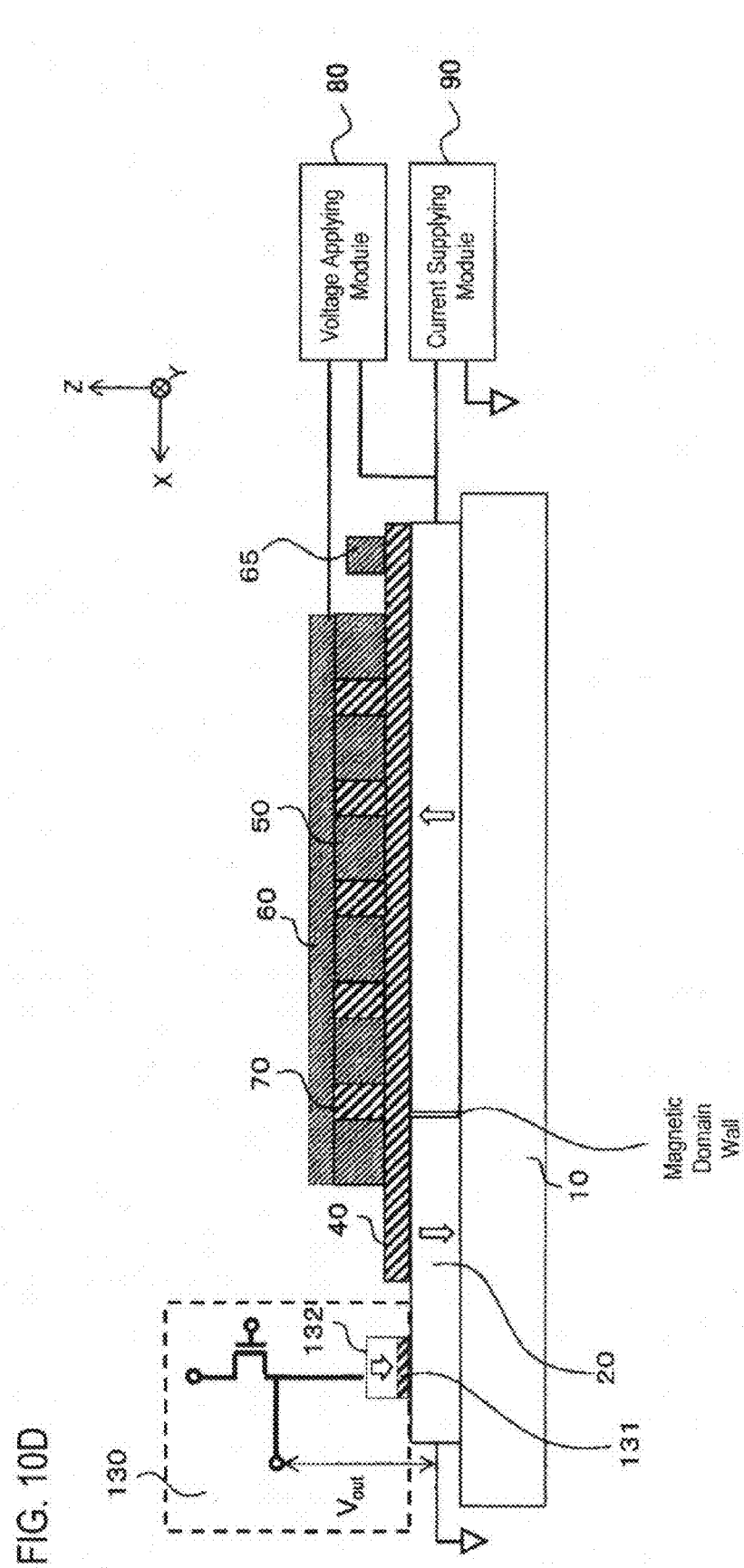

Next, how an operation of reading from the magnetic memory 100 is performed will be described in a specific manner with reference to FIGS. 10A to 10F. In FIGS. 10A to 10F, the first electrode 30 and the second electrode 35 are omitted. FIG. 10F shows a relationship between an output voltage that is read out by the detector 130 and the number of reading operation cycles. Cycle 1 to cycle 6 correspond to FIGS. 10A to 10E, respectively.

It is assumed that in an initial state, information "011011" is written in the magnetic memory 100 as shown in FIG. 10A. At this point, a voltage $V_{low}$ is read out by the detector 130, which means that data "0" is stored. FIG. 10A shows that three magnetic domain walls are formed in the magnetic wire 20.

Then, the operation A and the operation B (described above) are performed in this order. As a result, the magnetic domain walls are moved leftward in the magnetic wire 20 by the width W of each third electrode 50 in the extending direction of the magnetic wire 20. At this time, the magnetic domain wall that exists in the portion of the magnetic wire 20 which is right under the second insulating layer 70 between the fifth third electrode 50 and the sixth third electrode 50 disappears. Also, the upward magnetization formed in the portion of the magnetic wire 20 which is right under the second insulating layer 70 between the fourth and fifth third electrodes 50 has no potential barrier on the left side thereof. Therefore, the current $I_c$ caused to flow through the magnetic wire 20 changes the magnetization direction of the portion, right under the detector 130, of the magnetic wire 20 from downward to upward. As a result, the resistance of the tunneling magnetic coupling of the detector 130 becomes large. Therefore, a voltage $V_{high}$ ($>V_{low}$) is read out by the detector 130. This means that data "1" is stored (FIG. 10B).

Then, the operation A and the operation B are performed in this order. As a result, the magnetic domain wall that exists in the portion of the magnetic wire 20 which is right under the second insulating layer 70 between the third third electrode 50 and the fourth third electrode 50 and the magnetic domain wall that exists in the portion of the magnetic wire 20 which is right under the second insulating layer 70 between the fourth third electrode 50 and the fifth third electrode 50 are moved leftward by the width W of the respective third electrodes 50 in the extending direction of the magnetic wire 20. The voltage $V_{high}$ is again read out by the detector 130 (see FIG. 10C).

Then, the operation A and the operation B are performed in this order. As a result, the magnetic domain wall that exists in the portion of the magnetic wire 20 which is right under the second insulating layer 70 between the fourth third electrode 50 and the fifth third electrode 50 and the magnetic domain wall that exists in the portion of the magnetic wire 20 which is right under the second insulating layer 70 between the fifth third electrode 50 and the sixth third electrode 50 are moved leftward by the width W of the third electrodes 50 in the extending direction of the magnetic wire 20 (see FIG. 10D). At this time, the magnetic domain wall that exists in the portion of the magnetic wire 20 which is right under the second insulating layer 70 between the fifth third electrode 50 and the sixth third electrode 50 is moved to the left side on the sheet of FIG. 10C. Also, the downward magnetization formed in the portion of the magnetic wire 20 which is right under the fifth third electrode 50 has no potential barrier on the left side thereof. Therefore, the current $I_c$ caused to flow through the magnetic wire 20 changes the magnetization direction of the portion, right under the detector 130, of the magnetic wire 20 from upward to downward. As a result, the voltage $V_{low}$ is read out by the detector 130. This means that data "0" is stored.

Then, the operation A and the operation B are performed in this order. As a result, only the upward magnetization remains in the magnetic wire 20 (see FIG. 10E).

As described above, data can be read from the magnetic memory 100 bit by bit by operating application of the voltages and applying spin torque with a current. That is, data stored in the magnetic memory 100 can be read out correctly.

Figure 11:
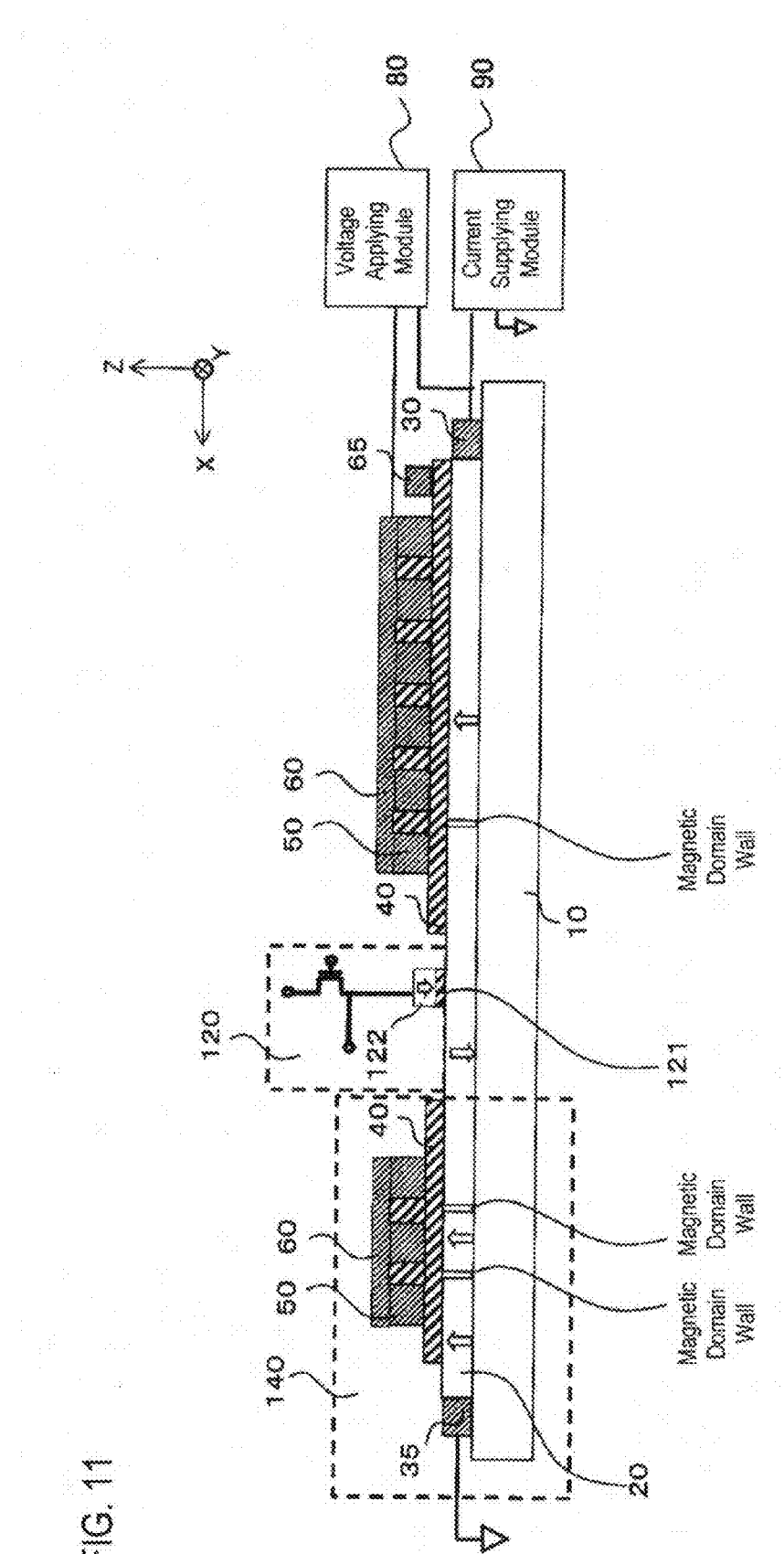
FIG. 11 shows the configuration of a buffer storage of the magnetic memory according to the first embodiment.
Figure 12B:
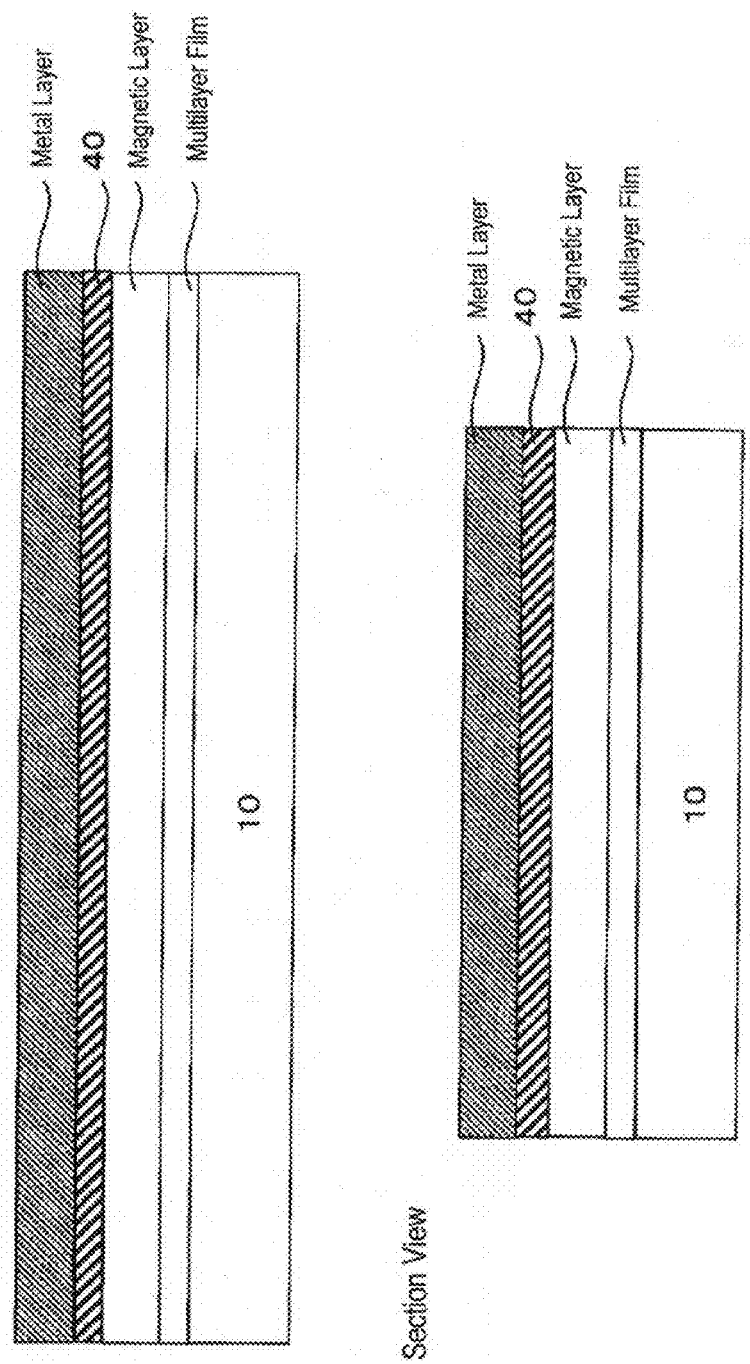

As shown in FIG. 11, a buffer storage 140 may be provided by extending the magnetic wire 20 leftward from the detector 130. The buffer storage 140 can prevent an event that data stored in the magnetic memory 100 is destroyed during the reading operation.

Next, an example of a method for manufacturing the magnetic memory 100 will be described with reference to FIGS. 12A to 12F. The bottom part of each of FIGS. 12A to 12F is a section view when viewed from the extending direction of the magnetic wire 20.

As shown in FIG. 12A, the magnetic memory 100 is surrounded by an insulator except that the fourth electrode 60 is exposed from the insulator. If necessary, the voltage applying module 80, the detector 130, etc. may be connected to the magnetic memory 100 by processing the magnetic memory 100 properly.

At first, a multilayer film is formed on a thermal oxidation silicon film (substrate 10) formed on an Si substrate in order of a Ta film, a Ru film, and a Ta film using an ultrahigh vacuum sputtering machine. Thereafter, a magnetic layer, which will become the magnetic wire 20, the first insulating layer 40, and a metal (Cu) layer, which will become the third electrodes 50, are deposited in this order (see FIG. 12B). The multilayer film is formed to prevent the magnetic and electrical properties of the magnetic layer from affecting a surface state of the substrate 10, uncertain factors involved in the deposition process, etc.

Then, a negative resist is applied to the metal layer. A mask pattern is formed by exposing and developing a part of the negative resist using an electron beam lithography machine. The metal layer to the multilayer film are milled through the thus-formed mask pattern using an ion milling machine. The mask pattern is removed by a remover (FIG. 12C). As a result, the magnetic wire 20 is formed as shown in the bottom part of FIG. 12C.

Then, a positive resist is applied to the metal layer. A mask pattern is formed by exposing and developing a part of the positive resist using an electron beam lithography machine. The metal layer is milled through the thus-formed mask pattern using an ion milling machine while the milling depth is adjusted using a mass spectrograph which is provided in the ion milling machine. The mask pattern is removed by a remover (see FIG. 12D). As a result, the third electrodes 50 are formed on the first insulating layer 40 as shown in FIG. 12D.

Then, silicon oxide which will become an insulator is deposited on the substrate 10, the third electrodes 50, and the first insulating layer 40 in an ultrahigh vacuum sputtering machine. Excess silicon oxide is ground away by chemical mechanical polishing (CMP). The grinding is performed until the top surfaces of the third electrodes 50 are exposed (see FIG. 12E).

Finally, Cu which will become the fourth electrode 60 is deposited on the third electrodes 50 and on the insulator in an ultrahigh vacuum sputtering machine. Then, a negative resist is applied to the Cu layer. A mask pattern is formed by exposing and developing a part of the negative resist using an electron beam lithography machine. The Cu layer is milled through the thus-formed mask pattern using an ion milling machine. The mask pattern is removed by a remover (see FIG. 12F). Thus, a magnetic memory 100 is completed.

Modification Example 1

FIG. 13 shows a magnetic memory 200 according to a first modification example of the magnetic memory 100. The magnetic memory 200 is different from the magnetic memory 100 in that a third insulating layer 210, a fourth insulating layer 220, fifth electrodes 230, a sixth electrode 240 are formed additionally between the magnetic wire 20 and the substrate 10.

The third insulating layer 210 is provided on the opposite side of the magnetic wire 20 to the side where the first insulating layer 40 is provided. The third insulating layer 210 may be made of the same material as the first insulating layer 40.

The fourth insulating layer 220 is provided on the opposite side of the third insulating layer 210 to the side where the magnetic wire 20 is provided, and is opposed to the third electrodes 50. The fourth insulating layer 220 may be made of the same material as the second insulating layer 70.

The fifth electrodes 230 are provided on the opposite side of the third insulating layer 210 to the side where the magnetic wire 20 is provided, and is opposed to the second insulating layer 70. The sixth electrode 240 extends in same direction as the extending direction of the magnetic wire 20 and is electrically connected to the fifth electrodes 230. The sixth electrode 240 is approximately the same in electric resistance as the fourth electrode 60. The fifth electrodes 230 and the sixth electrode 240 may be made of the same material as the first electrode 30, the second electrodes 50, and the fourth electrode 60. The fifth electrodes 230 and the sixth electrode 240 may be integral with each other.

The principle of an operation of the magnetic memory 200 is different from that of the magnetic memory 100 in that a voltage is applied so that the third electrodes 50 and the fifth electrodes 230 have different electric potentials. That is, when the third electrodes 50 are given a negative potential, the fifth electrodes 230 are given a positive potential. With this measure, higher potential barriers are formed in the magnetic wire 20 and hence, movement of a magnetic domain wall(s) in the magnetic wire 20 can be controlled more accurately.

Modification Example 2

FIG. 14 shows a magnetic memory 300 according to a second modification example of the magnetic memory 100. The magnetic memory 300 is different from the magnetic memory 100 in that the first insulating layer 40 is formed only between the magnetic wire 20 and the third electrodes 50.

Therefore, in the magnetic memory 300, the second insulating layer 70 is in direct contact with the magnetic wire 20. If the first insulating layer 40 and the second insulating layer 70 are made of different materials that give different degrees of interface-induced magnetic anisotropy to the magnetic wire 20 (for example, the first insulating layer 40 is made of magnesium oxide (MgO) and the second insulating layer 70 is made of silicon oxide ($SiO_x$)), a spatial distribution of magnetic energy is formed in the magnetic wire 20 even in an equilibrium state in which no voltage is applied. This makes it possible to prevent such a phenomenon that a magnetic domain wall(s) are moved by disturbance such as heat or an external magnetic field.

Modification Example 3

Figure 15:
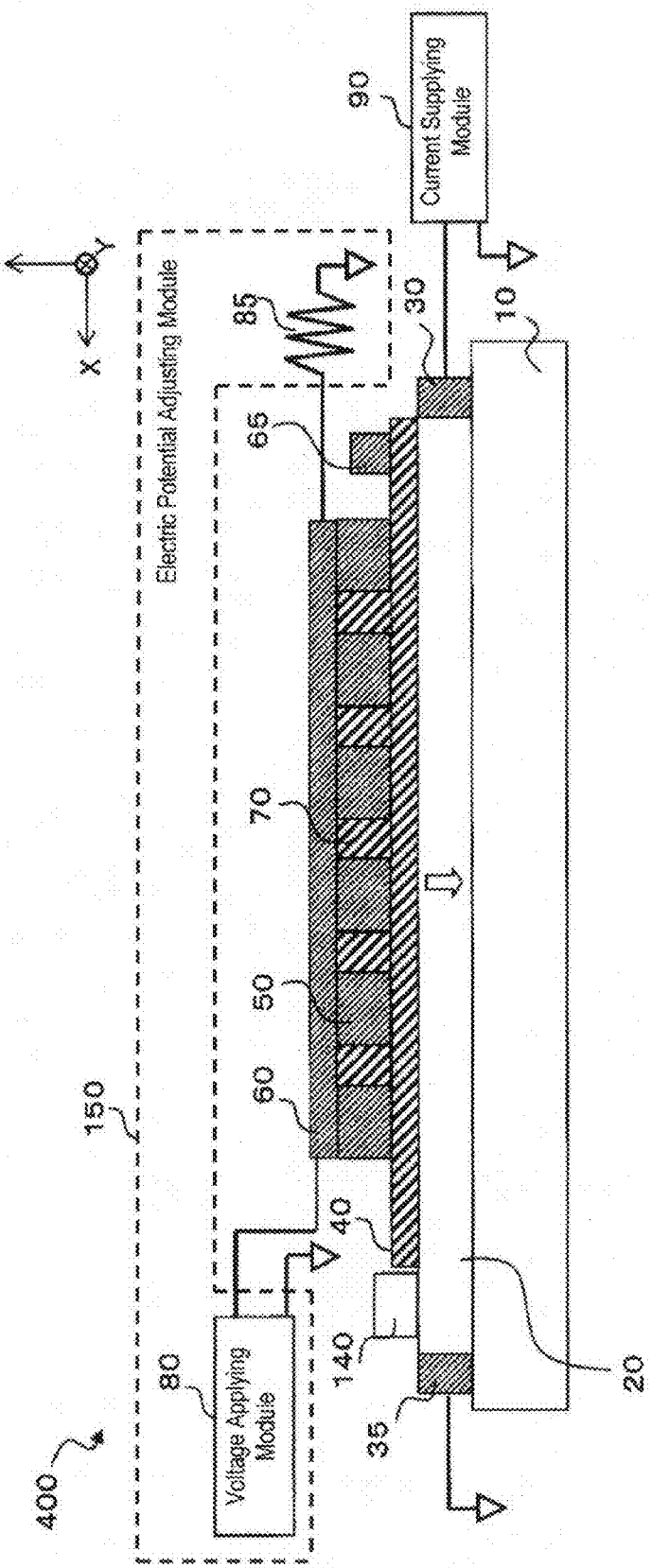
FIG. 15 shows the configuration of a magnetic memory according to a third modification example.

FIG. 15 shows a magnetic memory 400 according to a third modification example of the magnetic memory 100. The magnetic memory 400 has an electric potential adjusting module 150. The electric potential adjusting module 150 in which the voltage applying module 80 and a resistor 85 are connected to each other adjusts the electric potential of the fourth electrode 60. The voltage applying module 80 is connected to the third portion E2 of the fourth electrode 60 and grounded on the other side. The resistor 85 is connected to the fourth portion E1 of the fourth electrode 60 and grounded on the other side. The electric potential adjusting module 150 gives the fourth electrode 60 an electric potential distribution that decreases monotonously from the third portion E2 thereof to the fourth portion E1 thereof. In this case, the voltage applying module 80 may applies a DC voltage to the fourth electrode 60. The resistance of the resistor 85 may be set so that a voltage drop occurring in the fourth electrode 60 becomes approximately equal to a voltage drop occurring in the magnetic wire 20 in moving a magnetic domain wall(s).

The third medication can increase the operation speed though the power consumption is higher than that in the embodiment.

In the magnetic memories according to the embodiment and the modification examples, movement of a magnetic domain wall(s) can be controlled with high accuracy.

Although the embodiments have been described above, the embodiments are just examples and are not intended to limit the scope of the invention. The embodiments may be practiced in other various forms. A part of each embodiment may be omitted, replaced by other elements, or changed in various manners without departing from the spirit and scope of the invention. Such modifications are also included in the invention as claimed and its equivalents.

What is claimed is:

1. A magnetic memory comprising:
    a magnetic wire
        including a first portion and a second portion,
        having a first electric resistance value between the first portion and the second portion, and
        configured to form plural magnetic domains which are separated from each other by magnetic domain walls;
    a first insulating layer formed on the magnetic wire;
    plural first electrodes formed on the first insulating layer, arranged along the magnetic wire, and spaced from each other;
    a second electrode including
        a third portion being closer to the first portion than the second portion, and
        a fourth portion being closer to the second portion than the first portion, the second electrode electrically connected to the plural first electrodes between the third portion and the fourth portion and having a second electric resistance value being larger than the first electric resistance value;
    a current supplying module configured to supply the magnetic wire with a pulse current flowing from the first portion to the second portion; and
    a voltage applying module configured to apply, between the second portion and the fourth portion, a voltage that decreases with time.

2. The magnetic memory of claim 1, wherein the voltage applying module is configured to apply a first voltage so that the second electrode is higher in electric potential than the magnetic wire and to apply the voltage that decreases until the first voltage first reaches the third portion of the second electrode.

3. The magnetic memory of claim 2, wherein the current supplying module is configured to supply the pulse current in synchronism with an event that the first voltage first reaches the third portion of the second electrode.

4. The magnetic memory of claim 3, wherein after the first voltage first reaches the third portion of the second electrode, the voltage applying module is configured to apply a second voltage so that the second electrode is lower in electric potential than the magnetic wire and to apply the voltage that decreases until that the second voltage first reaches the third portion of the second electrode.

5. The magnetic memory of claim 4, wherein the current supplying module is configured to supply another pulse current in synchronism with an event that the second voltage first reaches the third portion of the second electrode.

6. The magnetic memory of claim 1, wherein the first electrodes and the second electrode are an integrated member.

7. The magnetic memory of claim 1, further comprising:
    a magnetic field generator configured to cause a magnetic field to act on the magnetic wire; and
    a detector configured to detect a magnetization direction of each of the plural magnetic domains.

8. A magnetic memory comprising:
a magnetic wire
  including a first portion and a second portion,
  having a first electric resistance value between the first portion and the second portion, and
  configured to form plural magnetic domains which are separated from each other by magnetic domain walls;
a first insulating layer formed on the magnetic wire;
plural first electrodes formed on the first insulating layer, arranged along the magnetic wire, and spaced from each other;
a second electrode including
  a third portion being closer to the first portion than the second portion, and
  a fourth portion being closer to the second portion than the first portion, the second electrode electrically connected to the plural first electrodes between the third portion and the fourth portion and having a second electric resistance value being larger than the first electric resistance value;
a current supplying module configured to supply the magnetic wire with a pulse current flowing from the first portion to the second portion; and
a voltage applying module configured to apply, between the first portion and the third portion, a voltage that decreases with time.

9. A magnetic memory comprising:
a magnetic wire
  including a first portion and a second portion,
  having a first electric resistance value between the first portion and the second portion, and
  configured to form plural magnetic domains which are separated from each other by magnetic domain walls;
a first insulating layer formed on the magnetic wire;
plural first electrodes formed on the first insulating layer, arranged along the magnetic wire, and spaced from each other;
a second electrode including
  a third portion being closer to the first portion than the second portion, and
  a fourth portion being closer to the second portion than the first portion, the second electrode electrically connected to the plural first electrodes between the third portion and the fourth portion and having a second electric resistance value being larger than the first electric resistance value;
a current supplying module configured to supply the magnetic wire with a pulse current flowing from the first portion to the second portion; and
an electric potential adjusting module configured to give the second electrode an electric potential distribution that decreases from the third portion to the fourth portion.

10. The magnetic memory of claim 9, wherein
the electric potential adjusting module comprises
  a voltage applying module configured to apply a constant voltage to the third portion, and
  a resistor connected to the fourth portion.

* * * * *